(12) United States Patent
Herbert et al.

(10) Patent No.: US 12,278,031 B2
(45) Date of Patent: Apr. 15, 2025

(54) SOFT MAGNETIC COMPOSITE MATERIALS AND METHODS AND POWDERS FOR PRODUCING THE SAME

(71) Applicant: Carpenter Technology Corporation, Philadelphia, PA (US)

(72) Inventors: Francis William Herbert, Pennsylvania, PA (US); Chins Chinnasamy, Lancaster, PA (US); James William Sears, Reading, PA (US); Christopher Phillip Allen, West Reading, PA (US); Jaydip Das, Santa Clara, CA (US); Nir Vaks, Reading, PA (US)

(73) Assignee: Carpenter Technology Corporation, Philadelphia, PA (US)

( * ) Notice: Subject to any disclaimer, the term of this patent is extended or adjusted under 35 U.S.C. 154(b) by 422 days.

(21) Appl. No.: 17/094,431

(22) Filed: Nov. 10, 2020

(65) Prior Publication Data

US 2021/0142933 A1    May 13, 2021

Related U.S. Application Data

(60) Provisional application No. 62/933,785, filed on Nov. 11, 2019.

(51) Int. Cl.
*H01F 1/147*    (2006.01)
*B22F 1/068*    (2022.01)
(Continued)

(52) U.S. Cl.
CPC .............. *H01F 1/147* (2013.01); *B22F 1/08* (2022.01); *B22F 1/102* (2022.01); *B22F 1/16* (2022.01);
(Continued)

(58) Field of Classification Search
CPC ......... B33Y 10/00; B33Y 70/00; B33Y 80/00; B22F 1/08; B22F 1/102; B22F 1/16;
(Continued)

(56) References Cited

U.S. PATENT DOCUMENTS 4,177,089 A    12/1979    Bankson
5,238,507 A    8/1993    Kugimiya et al.
(Continued)

FOREIGN PATENT DOCUMENTS

CN    104332265 A    2/2015
EP    0541887 A1    5/1993
(Continued)

OTHER PUBLICATIONS

Maklakov et al. Corrosion-resistive magnetic powder Fe@SiO2 for microwave applications, Journal of Alloys and Compounds 706 (2017) pp. 267-273 (Year: 2017).*
(Continued)

*Primary Examiner* — Rebecca Janssen
(74) *Attorney, Agent, or Firm* — Goodwin Procter LLP

(57) ABSTRACT

A powder including a plurality of particulates, each particulate including a soft magnetic metallic core coated with a continuous dielectric coating having a thickness selected from a range of 100 nanometers to 100 micrometers. The particulates have a mean particle size selected from a range of 100 nanometers to 250 micrometers. Methods for forming the powder are disclosed. A soft magnetic composite component includes a soft magnetic material in a dielectric matrix, wherein (i) the soft magnetic material comprises a plurality of particulates comprising metallic cores, (ii) each metallic core is coated by a continuous dielectric coating covering >90% of a surface area of the metallic core, (iii) the metallic cores are electrically isolated from each other, and (iv) the dielectric coatings of adjacent metallic cores are
(Continued)

consolidated together. Methods for formation of the soft magnetic component by additive manufacturing and hot isostatic pressing are disclosed.

16 Claims, 10 Drawing Sheets

(51) Int. Cl.
| | |
|---|---|
| B22F 1/08 | (2022.01) |
| B22F 1/102 | (2022.01) |
| B22F 1/16 | (2022.01) |
| B22F 3/15 | (2006.01) |
| B22F 10/10 | (2021.01) |
| B22F 10/12 | (2021.01) |
| B22F 10/14 | (2021.01) |
| B22F 10/20 | (2021.01) |
| B22F 10/34 | (2021.01) |
| B22F 10/64 | (2021.01) |
| B33Y 10/00 | (2015.01) |
| H01F 41/02 | (2006.01) |
| B22F 1/065 | (2022.01) |

(52) U.S. Cl.
CPC ............... B22F 3/15 (2013.01); B22F 10/10 (2021.01); B22F 10/12 (2021.01); B22F 10/14 (2021.01); B22F 10/20 (2021.01); B22F 10/64 (2021.01); B33Y 10/00 (2014.12); H01F 41/02 (2013.01); B22F 1/065 (2022.01); B22F 1/068 (2022.01); B22F 10/34 (2021.01); B22F 2304/056 (2013.01)

(58) Field of Classification Search
CPC .. B22F 3/15; B22F 10/10; B22F 10/12; B22F 10/14; B22F 10/20; B22F 10/64; B22F 1/065; B22F 1/068; B22F 10/34; B22F 2304/056; B22F 2998/10; B22F 9/04; B22F 9/08; B22F 9/16; H01F 1/147; H01F 41/02; H01F 1/24; Y02P 10/25; C23C 4/134; C23C 16/403; C23C 16/4417; C23C 16/45555; C23C 24/08; C23C 4/02; C23C 4/10; C23C 4/11; C23C 4/129; C23C 4/18; C23C 28/04; C23C 28/042; C22C 2202/02; C22C 32/00; C22C 33/02

See application file for complete search history.

(56) References Cited

U.S. PATENT DOCUMENTS

| | | | |
|---|---|---|---|
| 5,352,522 A | 10/1994 | Kugimiya et al. | |
| 5,629,092 A | 5/1997 | Gay et al. | |
| 6,051,324 A | 4/2000 | Moorhead et al. | |
| 6,171,363 B1 | 1/2001 | Shekhter et al. | |
| 6,203,897 B1 | 3/2001 | Koizumi et al. | |
| 6,485,579 B1 | 11/2002 | Nillius et al. | |
| 6,686,406 B2 | 2/2004 | Tomomatsu et al. | |
| 6,762,925 B2 | 7/2004 | Uchida et al. | |
| 6,817,085 B2 | 11/2004 | Uchikoba et al. | |
| 7,147,916 B2 | 12/2006 | Iwasaki et al. | |
| 7,172,660 B2 | 2/2007 | Song et al. | |
| 7,175,717 B2 | 2/2007 | Song et al. | |
| 7,255,941 B2 | 8/2007 | Kijima et al. | |
| 7,390,567 B2 | 6/2008 | Matsukawa et al. | |
| 7,532,099 B2 | 5/2009 | Brunner | |
| 7,700,194 B2 | 4/2010 | Suetsuna et al. | |
| 7,740,939 B2 | 6/2010 | Harada et al. | |
| 7,815,820 B2 | 10/2010 | Tan et al. | |
| 7,871,474 B2 | 1/2011 | Unoki et al. | |
| 8,313,087 B2 | 11/2012 | Hesse et al. | |
| 8,329,087 B2 | 12/2012 | Shimizu | |
| 8,840,800 B2 | 9/2014 | Suetsuna et al. | |
| 8,864,929 B2 | 10/2014 | Aramaki et al. | |
| 9,196,403 B2 | 11/2015 | Maeda et al. | |
| 9,248,501 B1 | 2/2016 | Johannes et al. | |
| 9,251,458 B2 | 2/2016 | Finn et al. | |
| 9,596,755 B2 | 3/2017 | Sethumadhavan et al. | |
| 9,676,927 B2 | 6/2017 | Musick et al. | |
| 9,887,598 B2 | 2/2018 | Hosek et al. | |
| 9,943,909 B2 | 4/2018 | Akimoto et al. | |
| 10,022,789 B2 | 7/2018 | Hosek et al. | |
| 10,150,184 B2 | 12/2018 | Bruck et al. | |
| 10,259,072 B2 | 4/2019 | Holcomb | |
| 10,269,479 B2 | 4/2019 | Simon et al. | |
| 10,312,019 B2 | 6/2019 | Zlatkov | |
| 10,328,491 B2 | 6/2019 | Heikkila | |
| 2002/0025272 A1* | 2/2002 | Witherspoon | B30B 11/02 419/68 |
| 2003/0129405 A1 | 7/2003 | Zhang et al. | |
| 2004/0060683 A1 | 4/2004 | Sercombe et al. | |
| 2004/0086708 A1 | 5/2004 | Verma et al. | |
| 2005/0019558 A1 | 1/2005 | Verma et al. | |
| 2005/0257854 A1* | 11/2005 | Maeda | H01F 1/24 148/105 |
| 2007/0290161 A1 | 12/2007 | Tokuoka et al. | |
| 2009/0197063 A1 | 8/2009 | Uchikiba et al. | |
| 2010/0001226 A1 | 1/2010 | Aramaki et al. | |
| 2013/0056674 A1 | 3/2013 | Inagaki et al. | |
| 2013/0057371 A1 | 3/2013 | Shimoyama et al. | |
| 2013/0292081 A1* | 11/2013 | Hosek | B22F 3/1039 164/271 |
| 2014/0291886 A1 | 10/2014 | Mark et al. | |
| 2015/0050178 A1 | 2/2015 | Chan et al. | |
| 2015/0076732 A1 | 3/2015 | Kemmer et al. | |
| 2015/0353773 A1 | 12/2015 | Dornseif et al. | |
| 2016/0043602 A1 | 2/2016 | Hosek et al. | |
| 2016/0064144 A1 | 3/2016 | Wang | |
| 2016/0230026 A1 | 8/2016 | Furusawa | |
| 2016/0263833 A1 | 9/2016 | Vittitow et al. | |
| 2016/0307679 A1 | 10/2016 | Taheri et al. | |
| 2016/0368056 A1 | 12/2016 | Swaminathan et al. | |
| 2017/0095858 A1 | 4/2017 | Stankowski et al. | |
| 2017/0120386 A1 | 5/2017 | Lin et al. | |
| 2017/0144224 A1 | 5/2017 | DeMuth et al. | |
| 2017/0239719 A1* | 8/2017 | Buller | B29C 64/40 |
| 2017/0252804 A1 | 9/2017 | Hanni et al. | |
| 2017/0306221 A1 | 10/2017 | Koole et al. | |
| 2018/0001553 A1 | 1/2018 | Buller et al. | |
| 2018/0021854 A1 | 1/2018 | Fukada et al. | |
| 2018/0158604 A1 | 6/2018 | Craft et al. | |
| 2018/0214944 A1 | 8/2018 | Martin et al. | |
| 2018/0298215 A1 | 10/2018 | Andersen et al. | |
| 2018/0311728 A1 | 11/2018 | Kottilingam et al. | |
| 2018/0319108 A1 | 11/2018 | Sherrer et al. | |
| 2018/0339340 A1 | 11/2018 | Karlen et al. | |
| 2018/0369909 A1 | 12/2018 | Ibe et al. | |
| 2018/0369912 A1 | 12/2018 | Gold | |
| 2019/0062871 A1 | 2/2019 | Wilson et al. | |
| 2019/0076926 A1 | 3/2019 | Imano et al. | |
| 2019/0193151 A1 | 6/2019 | Okumura et al. | |
| 2019/0193160 A1 | 6/2019 | Brunhuber et al. | |
| 2020/0399744 A1 | 12/2020 | Smith et al. | |
| 2021/0035716 A1* | 2/2021 | Adharapurapu | C22C 33/0285 |

FOREIGN PATENT DOCUMENTS

| | | |
|---|---|---|
| EP | 1201621 A1 | 5/2002 |
| EP | 1521276 A2 | 4/2005 |
| EP | 2226142 A1 | 9/2010 |
| EP | 2752244 A1 | 7/2014 |
| EP | 3138643 A1 | 3/2017 |
| JP | H04226003 A | 8/1992 |
| JP | H06204021 A | 7/1994 |
| JP | 4211591 B2 | 1/2009 |
| JP | 4601907 B2 | 12/2010 |
| JP | 5555945 B2 | 7/2014 |
| KR | 101826421 B1 | 3/2018 |
| WO | WO-2007/052772 A1 | 5/2007 |
| WO | 2014/149761 A2 | 9/2014 |

(56) References Cited

FOREIGN PATENT DOCUMENTS

| WO | WO-2015142494 A1 | 9/2015 |
|---|---|---|
| WO | WO-2016/196223 A1 | 12/2016 |
| WO | WO-2017099478 A1 | 6/2017 |
| WO | WO-2017203717 A1 | 11/2017 |
| WO | WO-2018091855 A1 | 5/2018 |
| WO | WO-2018167430 A1 | 9/2018 |
| WO | WO-2018/208155 A1 | 11/2018 |
| WO | WO-19089764 | 5/2019 |
| WO | WO-2020014287 A2 | 1/2020 |

OTHER PUBLICATIONS

The International Search Report and Written Opinion for PCT/US2020/059872 dated Feb. 4, 2021.

"3D Printing New Method, Additive Manufacturing with Powder Bed," Aerospace Engineering, https://www.youtube.com/watch?app=desktop&v=r0vL1-S5ZtQ, Nov. 5, 2017.

Akedo, "Aerosol Deposition of Ceramic Thick Films at Room Temperature: Densification Mechanism of Ceramic Layers," Journal of the American Ceramic Society, (2006), vol. 89, Issue 6, pp. 1834-1839, (Abstract only).

Benack, et al., "Additive Manufacturing Methods for Soft Magnetic Composites (SMCs)," Microsc. Microanal., (2018), 24 Suppl 1, pp. 1066-1067.

"Metal Powder and Powder Metallurgy Technology," Mechanicstips.blogspot.com, https://www.youtube.com/watch?v=weystTEhGkk, Mar. 23, 2018.

Murr, "A Metallographic Review of 3D Printing/Additive Manufacturing of Metal and Alloy Products and Components," Metallography, Microstructure, and Analysis, (2018), pp. 103-132.

Roy, et al., "Characterization of Nanocrystalline NiCuZn Ferrite Powders Synthesized by Sol-Gel Auto-Combustion Method," Journal of Materials Processing Technology, (2008), vol. 197, Issues 1-3, pp. 279-283.

Shishkovsky, et al., "Thermoelectric Properties of Gradient Polymer Composites with Nano-Inclusions Fabricated by Laser Assisted Sintering," Laser Physics Letters, (2017), vol. 14, No. 3, (Abstract only).

Yan, et al., "Additive Manufacturing of Magnetic Components for Power Electronics Integration," Presentation at 3DPEIM, (2016), pp. 1-12.

Suzuki et al. (1997) "Native Oxide Layers Formed on the Surface of Ultra High-Purity Iron and Copper Investigated by Angle Resolved XPS," Materials Transactions, JIM 38(11):1004-1009.

Martin et al. (2017) "3D printing of high-strength aluminium alloys," Nature (549):365-380.

Smith et al. "NASA High Temperature Alloy Development—GRX-810," Turbo Expo 2023 (16 pages).

* cited by examiner

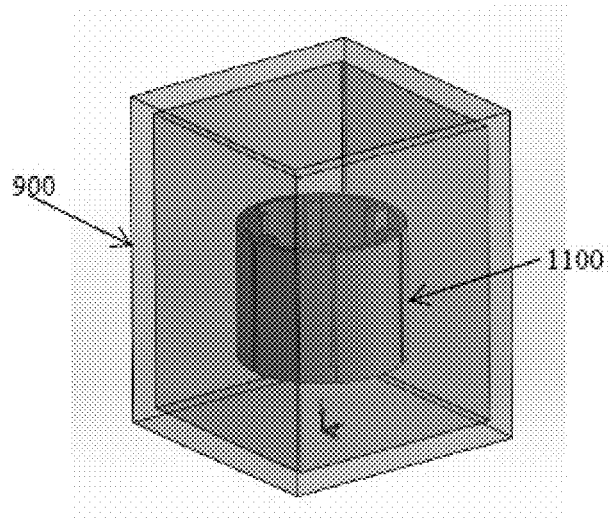 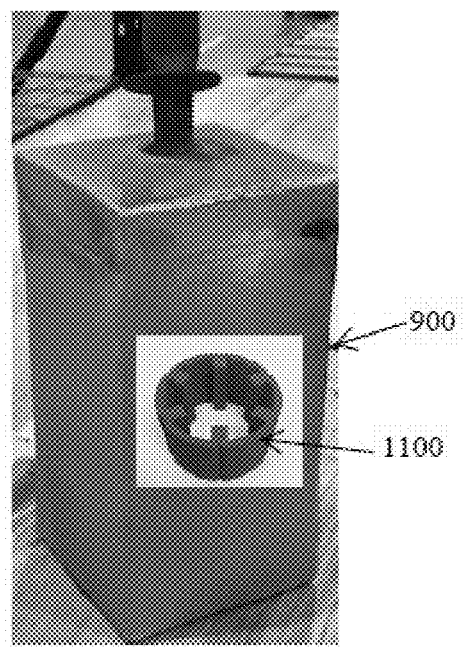
Figure 11a                                Figure 11b

SOFT MAGNETIC COMPOSITE MATERIALS AND METHODS AND POWDERS FOR PRODUCING THE SAME

RELATED APPLICATION

This application claims priority to and the benefit of U.S. Provisional Patent Application No. 62/933,785, filed on Nov. 11, 2019, incorporated herein by reference in its entirety.

FIELD OF THE INVENTION

Embodiments of the invention relate generally to soft magnetic composites, particularly to additive manufacturing with powders including soft magnetic cores and dielectric shells.

The disclosed materials and methods enable the formation of isotropic, high mechanical strength, high electrically resistivity, high permeability, high saturation induction, three dimensionally coated, complex structured soft magnetic components having mono- or hybrid dielectric layers with amorphous or crystalline structure disposed on soft magnetic cores, with optional diffusion reaction and/or transition layers made of magnetic and dielectric materials disposed therebetween.

BACKGROUND OF THE INVENTION

Additive manufacturing generally relates to the process of manufacturing 3D objects by building up layers of a material or materials. Conventionally, the materials may be supplied to additive manufacturing machines in the form of powders (e.g., metal powders).

High core loss in soft magnets limits the high frequency operation, and hence limiting core loss is critical in the design of high electrical resistivity soft magnets with high saturation induction for various power electronic components such as motors, generators, fuel injectors, ignition coils, inductors, baluns, antennas, transformers, multi-layer capacitors, and other transducers. For example, when soft magnets are subjected to variable magnetic flux and the electrical resistivity is low, excessive heat is generated due to eddy current. This increased heat may reduce the magnetic permeability of the soft magnets with corresponding reductions in the efficiency of the respective power electronic components.

SUMMARY

Adding shells of high resistivity dielectric material to soft magnetic cores generally results in a substantial decrease of eddy current losses. However, adding thicker shells of high resistivity material, for example epoxy polymers or dielectrics to soft magnetic cores, is typically associated with shortcomings in poor mechanical and magnetic properties. Specifically, these soft magnetic composites, three dimensionally coated/laminated with improved electrical resistivity, have met limitations in commercial use in passive and active electric power component applications due to shortcomings in mechanical and magnetic properties compared with the corresponding uncoated magnetic materials. Demands of high-performance electric power components require improved mechanical properties and high electrical resistivity without reducing the saturation flux density beyond those traditionally available soft magnetic composite materials in the market.

Soft magnetic composite parts are typically produced using conventional powder metallurgical processes such as casting and molding techniques followed by machining. This process is expensive and time consuming for making complex structured parts. Machinability of magnetic materials is a key aspect of controlling the costs of prototype and demonstration machines.

Additive manufacturing generally relates to the process of manufacturing 3D objects by building up layers of a material or materials. Conventionally, the materials may be supplied to additive manufacturing machines in the form of powders (e.g., metal powders).

Additive manufacturing methods are scalable and inexpensive method to make complex geometries of power electronic components such as stators, rotors, inductors and transformers. Also, preparing soft magnetic composites by additive manufacturing allows more flexible design and fabrication of complex 3-dimensional isotropic/anisotropic magnetic core components with ultimate design freedom, for example leveraging topologically optimized structures. An additional advantage of additive manufacturing methods is that no scrap metal will be generated during the fabrication of the soft magnetic cores, with associated potential environmental and cost benefits.

Producing power electronic components by using additive manufacturing and controlling the thickness of three dimensionally laminated soft magnets enables achievement of superior mechanical and electromagnetic properties.

Embodiments of the present invention relate to methods for forming three dimensionally laminated, soft magnets suitable for use in high performance, passive power electronic components such as inductors, transformers, chokes, stators, and rotors in rotating machines.

These applications are enabled by high electrical resistivity, high saturation flux density, high relative permeability, and low core loss of the soft magnets produced by the methods of the invention. Powder compacts comprising particles with magnetic cores and dielectric shells are characterized by high electrical resistivity combined with high mechanical properties and are suitable for use in ultra-compact power conversion and regulation circuits, RF/microwave components, on board inductors, filters and electromagnetic interference devices, and other electromagnetic devices. Embodiments of the invention fill the property gap between ferrite materials that have very high electrical resistivity but low saturation flux density, and soft magnetic metallic materials (either crystalline or amorphous) that have low electrical resistivity and high saturation flux density, as shown in FIG. 1. In particular, these components typically have an electrical resistivity between that of conventional soft magnetic alloys (Permalloy, Finemet, Metglas, Fe-6.5Si, Hiperco 50, and others) and ferrite soft magnetic materials (MnZn, NiZn, and others). However, the soft magnetic composite may span the range of saturation induction of 0.5 T-2.4 T, unlike ferrites that have low saturation induction of typically <1 T.

Magnetic composites are materials in which a soft or hard magnetic material in particulate form is bonded into a solid component within a matrix of another material with a high dielectric constant, i.e. a highly insulating material. Alternatively, particles are coated with a strong dielectric material prior to consolidation. The objective is to electrically isolate metallic magnetic particles from adjacent particles, thus increasing the resistivity of the overall composite, leading to an improvement in magnetic performance by reducing wasteful electrical eddy currents. This results in reduced core loss and higher energy efficiency, particularly under high frequency alternating current operating conditions.

The development of such soft magnetic materials enables reduced device sizes and improved efficiencies of power-handling electrical devices, such as motors, generators, inductors, baluns, antennae, transformers, multi-layer capacitors, and other transducers. Thus, magnetic composites have broad applications across consumer electronic devices, common mode chokes, inductors, motors, power electronic components, and other electrical and electromechanical devices.

Embodiments of the present invention relate to additive manufacturing of soft magnetic materials, which allows electrical device designers to explore complex, 3-dimensional geometries for static and rotating core components in power electronics, such as motors and generators, operating in frequency ranges from 10 Hz-10 GHz. Additive manufacturing of such devices may deliver efficiencies beyond material performance alone, including geometric improvements, coil winding savings, weight savings, and other benefits. Moreover, being an on-demand process, additive manufacturing offers the ability to rapidly iterate and improve new electromagnetic product designs at low cost, and to deliver supply chain savings in fabrication and delivery of these products.

A second application space enabled by embodiments of the present invention is high-frequency inductive devices used in power electronics, consumer electronics, and other end-use markets. Soft magnetic composites with high density, high electrical resistivity, high mechanical strength and high corrosion resistance composite magnetic dielectric parts are applicable to the power electronic devices that operate in the MHz to GHz range, The benefit offered by these materials as passive and active components include reduced component size and improved efficiencies in high and low temperature environments. Most conventional soft magnetic materials used in electronic devices are ferrites, which have low saturation induction and whose performance at low and high frequencies is rather poor since their soft magnetic resonance frequencies typically fall near or below 1 GHz. Permalloy is widely used in power electronics applications but has been used with limited frequency range due to its electrical conductivity. The skin depth and required lamination thicknesses to mitigate eddy currents becomes prohibitively small at higher frequencies. For example, at 10 $MH_2$ operating frequency, permalloy strip requires a lamination thickness of 2.2 μm, whereas at 10 GHz, only a 70 nm lamination thickness is needed.

Hence, soft magnetic composites including high magnetization and low coercivity powders with dimensions ranging from a few nanometers to micrometers either embedded in a dielectric matrix (e.g., oxides, phosphides, fluorides, sulfides and mixtures) or with a metal alloy (core)-dielectric (shell) morphology or metal alloy core, intermittent diffusion/transition layer contains a mixture of metallic and dielectric and dielectric shell morphology, as shown in FIG. 2, have a significant potential in high frequency applications.

For the purpose of embodiments the present invention, oxide based dielectrics may include, e.g., $BaTiO_3$, $Al_2O_3$, $HfO_2$, $HfSiO_4$, α-$TiO_2$, α-$SiO_2$, $ZrO_2$, $CeO_2$, $CoO$, $Cr_2O_3$, $MgO$, $Al_2O_3$, $SnO_2$, $NiO_2$, $GaO$, $GeO_2$, $Li_2O$, $Y_2O_3$, $La_2O_3$, $ZnO$, $ZrO_2$, $WO_3$, $TiO_2$, $Sc_2O_3$, $BaO$, $Eu_2O_3$, $SiO_2$, $Cs_2O$, $MoO_3$, $Nb_2O_5$, $TeO_2$, $Bi_2O_3$, $BaO$, $SrO$, $Ta_2O_5$, copper oxides, iron oxides, iron-cobalt oxides, iron-nickel oxides, and/or combinations thereof.

Alternatively oxyhydroxide based dielectrics may include, e.g., BaOOH, AlOOH, TiOOH, ZrOOH, CeOOH, Co(OOH), Sn(OOH), CR(OOH), Mn(OOH), Mg(OOH), Sn(OOH), Y(OOH), Hf(OOH), La(OOH), Zn(OOH), Sc(OOH), Eu(OOH), Mo(OOH), Nb(OOH), Te(OOH), Bi(OOH), and/or combination of any of these materials thereof.

In an aspect, embodiments of the invention relate to a method for fabricating a soft magnetic composite component by additive manufacturing. The method includes providing to an additive manufacturing system a powder comprising a plurality of particulates, each particulate comprising a soft magnetic metallic core coated with a continuous dielectric coating including a dielectric material. The soft magnetic composite component is fabricated by forming consolidated material from the powder by additive manufacturing. A porosity of the magnetic composite component is less than 5% by volume, and the soft magnetic metallic cores in the magnetic composite component are electrically and magnetically isolated from each other by a continuous three-dimensional network of the dielectric material.

One or more of the following features may be included. The metallic core may include a soft magnetic pure metal or alloy thereof including or consisting essentially of at least one of Fe, Co, Ni, Fe—Co, Fe—Ni, Fe—Si, FeCoSiB, amorphous magnetic materials, metal-metalloid systems (metallic glasses), and/or alloys and combinations thereof.

The metallic core may have a coercivity of 0.01 Oe to 50 Oe. The dielectric material may include physical interfaces disposed between proximate particulates.

The continuous dielectric coating may include a first surface layer including a first dielectric material including or consisting essentially of a hydride, an oxide, a nitride, a boride, a carbide, carbon, a sulfide, a fluoride, a polymer, phosphorus, and/or combinations thereof.

The hydride may include or consist essentially of $MgH_2$, $MBH_4$ (M=Li, Ca, Mg, Na, K), $MNH_2$ (M=Li and Mg), $MBH_4$+'MH (M=Li, Ca, Mg; 'M=Li, Mg, Ca), $MNH_2$+'MH (M=Li, Mg; 'M=Li), and/or combinations thereof.

The oxide may include or consist essentially of $BaTiO_3$, $Al_2O_3$, $HfO_2$, $HfSiO_4$, α-$TiO_2$, α-$SiO_2$, $ZrO_2$, $CeO_2$, $CoO$, $Cr_2O_3$, $MgO$, $Al_2O_3$, $SnO_2$, $NiO_2$, $GaO$, $GeO_2$, $Li_2O$, $Y_2O_3$, $La_2O_3$, $ZnO$, $ZrO_2$, $WO_3$, $TiO_2$, $Sc_2O_3$, $BaO$, $Eu_2O_3$, $SiO_2$, $Cs_2O$, $MoO_3$, $Nb_2O_5$, $TeO_2$, $Bi_2O_3$, $BaO$, $SrO$, $Ta_2O_5$, copper oxides, iron oxides, iron-cobalt oxides, iron-nickel oxides, and/or combinations thereof.

The nitride may include or consist essentially of AlN, BaN, BN, TiN, VN, CrN, and/or combinations thereof.

The continuous dielectric coating may include a second surface layer including a second dielectric material that includes an oxide, the second dielectric material being different from the first dielectric material.

The oxide of the second dielectric material may be a low melting point glassy oxide including or consisting essentially of $B_2O_3$, $Bi_2O_3$, PbO, $V_2O_5$, $TeO_2$, $Na_2O$, $K_2O$, $MoO_3$, and/or combinations thereof.

The first surface layer may include an oxide (A), and a second surface layer may be disposed on the first surface layer and include an oxide (B), with a combination (B-A) being $B_2O_3$—$Al_2O_3$, $B_2O_3$—$GeO_2$, $B_2O_3$—$SiO_2$, $B_2O_3$—$WO_3$, $B_2O_3$—$Cr_2O_3$, $B_2O_3$—$MoO_3$, $B_2O_3$—$Nb_2O_5$, $B_2O_3$—$Li_2O_3$, $B_2O_3$—$BaO$, $B_2O_3$—$ZnO$, $B_2O_3$—$La_2O_3$, $B_2O_3$—$CoO$, $B_2O_3$—$Cs_2O$, $B_2O_3$—$K_2O$, $K_2O$—$GeO_2$, $K_2O$—$SiO_2$, $K_2O$—$WO_3$, $K_2O$—$MoO_3$, $K_2O$—$Nb_2O_5$, $Na_2O$—$GeO_2$, $Na_2O$—$SiO_2$, $Na_2O$—$WO_3$, $Na_2O$—$MoO$, $Na_2O$—$Nb_2O_5$, $MoO_3$—$Cs_2O$, $MoO_3$—$Li_2O$, $MoO_3$—$WO_3$, $Cs_2O$—$SiO_2$, $Cs_2O$—$Nb_2O_5$, $B_2O_3$—$Al_2O_3$, $B_2O_3$—$GeO_2$, $B_2O_3$—$SiO_2$, $B_2O_3$—$WO_3$, $B_2O_3$—$Cr_2O_3$, $B_2O_3$—

$MoO_3$, $B_2O_3$—$Nb_2O_5$, $B_2O_3$—$Li_2O_3$, $B_2O_3$—$BaO$, $B_2O_3$—$ZnO$, $B_2O_3$—$La_2O_3$, $B_2O_3$—$CoO$, $B_2O_3$—$Cs_2O$, $B_2O_3$—$K_2O$, $K_2O$—$GeO_2$, $K_2O$—$SiO_2$, $K_2O$—$WO_3$, $K_2O$—$MoO_3$, $K_2O$—$Nb_2O_5$, $Na_2O$—$GeO_2$, $Na_2O$—$SiO_2$, $Na_2O$—$WO_3$, $Na_2O$—$MoO$, $Na_2O$—$Nb_2O_5$, $MoO_3$—$Cs_2O$, $MoO_3$—$Li_2O$, $MoO_3$—$WO_3$, $Cs_2O$—$SiO_2$, and/or $Cs_2O$—$Nb_2O_5$.

The sulfide may include or consist essentially of $Al_2S_3$, $Sb_2S_3$, $As_2S_3$, $BaS$, $BeS$, $Bi_2S_3$, $B_2S_3$, $CdS$, $CaS$, $CeS$, $Ce_2S_3$, $WS$, $Cr_2S_3$, $CoS$, $CoS_2$, $Cu_2S$, $CuS$, $Dy_2S_3$, $Er_2S_3$, $EuS$, $Gd_2S_3$, $Ga_2S_3$, $GeS$, $GeS_2$, $HfS_2$, $Ho_2S_3$, $In_2S$, $InS$, $FeS$, $FeS_2$, $La_2S_3$, $LaS_2$, $La_2O_2S$, $PbS$, $Li_2S$, $MgS$, $MnS$, $HgS$, $MoS_2$, $Nd_2S_3$, $S$, $NdS$, $K_2S$, $Pr_2S_3$, $Sm_2S_3$, $Sc_2S_3$, $SiS_2$, $Ag_2S$, $Na_2S$, $SrS$, $Tb_2S$, $Tl_2S$, $ThS_2$, $Tm_2S_3$, $SnS$, $SnS_2$, $TiS_2$, $WS_2$, $US_2$, $V_2S_3$, $Yb_2S_3$, $Y_2S_3$, $Y_2O_2S$, $ZnS$, $ZrS_2$, and/or combinations thereof.

The carbide may include or consist essentially of $CaC_2$, $SiC$, $WC$, $Fe_3C$, $TiC$, $ZrC$, $VC$, $NbC$, $TaC$, $Cr_3C_2$, $Mo_2C$, $HfC$, and/or combinations thereof.

The boride may include or consist essentially of $TiB_2$, $ZrB_2$, $HfB_2$, $VB_2$, $NbB$, $NbB_2$, $TaB$, $TaB_2$, $CrB_2$, $Mo_2B_5$, $W_2B_5$, $Fe_2B$, $FeB$ $CoB$, $Co_2B$, $NiB$, $Ni_2B$, $Al_3Mg_3B_{56}$, and/or combinations thereof.

The oxide may have a perovskite crystal structure ($ABO_3$).

The fluoride may include or consist essentially of $LiF_3$, $LiF_2$, $NdF_3$, $NdF_2$, $NdOF$, $LiOFMg$, $MgF_2$, $NdF_3$, $NdF_2$, $NdOF$, $MgOFCa$, $CaF_2$ $NdF_3$ $NdF_2$, $NdOF$, $CaOFLa$, $LaF_3$, $LaF_2$, $NdF_3$, $NdF_2$, $NdOF$, $LaOFCe$, $CeF_3$, $CeF_2$, $NdF_3$, $NdF_2$, $NdOF$, $CeOFPr$, $PrF_3$, $PrF_2$, $NdF_3$, $NdF_2$, $NdOF$, $PrOFNd$, $NdF_3$, $NdF_3$, $NdF_2$, $NdOF$, $NdOFSm$, $SmF_3$, $SmF_2$, $NdF_3$, $NdF_2$, $NdOF$, $SmOFEu$, $EuF_2$, $NdF_3$, $NdF_2$, $NdOF$, $EuOF$, and/or combinations thereof.

The polymer may include or consist essentially of a phenolic resin, an epoxy resin, an amide, a phosphoramide, a sulfonamide, a saturated fatty acid amide, an unsaturated fatty acid amide, and/or combinations thereof.

A thickness of the continuous dielectric coating may be less than 50 micrometers, e.g., less than 1 micrometer, or less than 200 nanometers.

Providing the powder may include forming the metallic core by at least one of gas atomization, water atomization, plasma atomization, rotating electrode atomization, centrifugal atomization, spinning water atomization process (S.W.A.P.), melt spinning, quenching, attrition, milling, hydrogen reduction, electrolytic powder production, a carbonyl iron process, and/or a carbonyl nickel process.

Providing the powder may include forming the continuous dielectric coating by at least one of formation of a native oxide by surface oxidation, atomic layer deposition (ALD), molecular layer deposition, physical vapor deposition (PVD), sol-gel, chemical vapor deposition (CVD), metal organic chemical vapor deposition (MOCVD), plasma torch synthesis, spray coating, high velocity oxygen fuel coating, arc coating, co-precipitation, epoxy coating, supercritical $CO_2$ method, high pressure coating, or combinations thereof.

Additive manufacturing may include Binder Jetting, Directed Energy Deposition, Mask-Image-Projection-Based Stereolithography, Material Extrusion, Material Jetting, Powder Bed Fusion, Sheet Lamination, nanoparticle additive manufacturing, and/or derivations or combinations thereof.

The magnetic composite component may be densified.

Providing the powder may include forming the continuous dielectric coating by functionalizing each magnetic metallic core by applying a plurality of dielectric nanoparticles to the core, and densifying the magnetic composite component may include consolidating the dielectric nanoparticles to form the continuous dielectric coating.

Functionalizing each magnetic metallic core may include (i) rapid mixing of a plurality of the magnetic metallic cores with the plurality of dielectric nanoparticles, (ii) ball milling of the magnetic metallic cores with the dielectric nanoparticles, and/or (iii) plasma spraying of dielectric nanoparticles onto the magnetic metallic cores.

The dielectric nanoparticles may include any of the materials disclosed herein for the dielectric coatings.

The magnetic composite component may be densified by, e.g., high temperature sintering, hot isostatic pressing, hot isostatic pressing by the crucible compaction process within a closed can containing at least one of particles or beads of ceramic material, pressing & sintering, compaction, cold isostatic pressing, spark plasma sintering, direct current sintering, microwave sintering, and/or combinations thereof.

The magnetic composite component may have a tensile breaking strength greater than 150 MPa.

Pores within the magnetic composite component may be isolated.

The three-dimensional network may cover more than 90% of a surface area of the soft magnetic metallic cores.

The particulates may have a unimodal particle size distribution with a mean particle size selected from a range of 100 nanometers to 250 micrometers, e.g., 10 micrometers to 250 micrometers.

The particulates may have a multi-modal particle size distribution, e.g., a bimodal distribution. A smaller mean particle size of the particulates may be from 1 micrometer to 100 micrometers, e.g., 1 micrometer to 50 micrometers, and a larger mean particle size of the powder may be from 15 micrometers to 250 micrometers, e.g., 15 micrometers to 150 micrometers. The powder may further include a plurality of uncoated soft magnetic particulates, and a smaller mean particle size of the powder may be a mean particle size of the uncoated soft magnetic particulates and a larger mean particle size may be a mean particle size of the coated particulates, the plurality of uncoated soft magnetic particulates and the coated particulates including a same alloy.

The continuous dielectric coating may include a plurality of heterogeneous surface layers.

The particulates may include nanoparticles having a particle size selected from a range of 100 nm to 1000 nm.

The continuous dielectric coating may include an amorphous structure and/or a crystalline structure.

The powder flowability may include a flow rate of at least one of greater than 50 grams per 25 seconds in a Hall flow test conducted to the ASTM B213 standard or greater than 50 grams per 5 seconds in a Carney flow test conducted to the ASTM B964 standard.

The powder may have an avalanche angle less than or equal to 45° as measured in a rotating, transparent drum filled with a known amount of powder.

In another aspect, embodiments of the invention relate to a powder including a plurality of particulates, with each particulate including a soft magnetic metallic core coated with a continuous dielectric coating having a thickness from a range of 100 nanometers to 100 micrometers. The particulates have a mean particle size selected from a range of 100 nanometers to 250 micrometers.

One or more of the following features may be included. The metallic core may include a soft magnetic pure metal or alloy thereof including or consisting essentially of at least one of Fe, Co, Ni, Fe—Co, Fe—Ni, Fe—Si, FeCoSiB, amorphous magnetic materials, metal-metalloid systems (metallic glasses), and/or alloys and combinations thereof.

The soft magnetic metallic core may have a coercivity selected from a range of 0.01 Oe to 50 Oe.

The continuous dielectric coating may include a first surface layer including a first dielectric material including or consisting essentially of a hydride, an oxide, a nitride, a boride, a carbide, carbon, a sulfide, a fluoride, a polymer, phosphorus, and/or combinations thereof.

The hydride may include or consist essentially of $MgH_2$, $MBH_4$ (M=Li, Ca, Mg, Na, K), $MNH_2$ (M=Li and Mg), $MBH_4+'MH_2$ (M=Li, Ca, Mg; 'M=Li, Mg, Ca), $MNH_2+'MH$ (M=Li, Mg; 'M=Li), and/or combinations thereof.

The oxide may include or consist essentially of $BaTiO_3$, $Al_2O_3$, $HfO_2$, $HfSiO_4$, $\alpha$-$TiO_2$, $\alpha$-$SiO_2$, $ZrO_2$, $CeO_2$, $CoO$, $Cr_2O_3$, $MgO$, $Al_2O_3$, $SnO_2$, $NiO_2$, $GaO$, $GeO_2$, $Li_2O$, $Y_2O_3$, $La_2O_3$, $ZnO$, $ZrO_2$, $WO_3$, $TiO_2$, $Sc_2O_3$, $BaO$, $Eu_2O_3$, $SiO_2$, $Cs_2O$, $MoO_3$, $Nb_2O_5$, $TeO_2$, $Bi_2O_3$, $BaO$, $SrO$, $Ta_2O_5$, copper oxides, iron oxides, iron-cobalt oxides, iron-nickel oxides, and/or combinations thereof.

The nitride may include or consist essentially of AlN, BaN, BN, TiN, VN, CrN, and/or combinations thereof.

The continuous dielectric coating may include a second surface layer including a second dielectric material that includes an oxide, the second dielectric material being different from the first dielectric material.

The oxide of the second dielectric material may be a low melting point glassy oxide including or consisting essentially of $B_2O_3$, $Bi_2O_3$, $PbO$, $V_2O_5$, $TeO_2$, $Na_2O$, $K_2O$, $MoO_3$, and/or combinations thereof, The first surface layer may include an oxide (A), a second surface layer may be disposed on the first surface layer and include an oxide (B), with a combination (B-A) being $B_2O_3$—$Al_2O_3$, $B_2O_3$—$GeO_2$, $B_2O_3$-$SaO_2$, $B_2O_3$—$WO_3$, $B_2O_3$—$Cr_2O_3$, $B_2O_3$—$MoO_3$, $B_2O_3$—$Nb_2O_5$, $B_2O_3$—$Li_2O_3$, $B_2O_3$—$BaO$, $B_2O_3$—$ZnO$, $B_2O_3$—$La_2O_3$, $B_2O_3$—$CoO$, $B_2O_3$—$Cs_2O$, $B_2O_3$—$K_2O$, $K_2O$—$GeO_2$, $K_2O$—$SiO_2$, $K_2O$—$WO_3$, $K_2O$—$MoO_3$, $K_2O$—$Nb_2O_5$, $Na_2O$—$GeO_2$, $Na_2O$—$SiO_2$, $Na_2O$—$WO_3$, $Na_2O$—$MoO$, $Na_2O$—$Nb_2O_5$, $MoO_3$—$Cs_2O$, $MoO_3$—$Li_2O$, $MoO_3$—$WO_3$, $Cs_2O$—$SiO_2$, $Cs_2O$—$Nb_2O_5$, $B_2O_3$—$Al_2O_3$, $B_2O_3$—$GeO_2$, $B_2O_3$-$SaO_2$, $B_2O_3$—$WO_3$, $B_2O_3$—$Cr_2O_3$, $B_2O_3$—$MoO_3$, $B_2O_3$—$Nb_2O_5$, $B_2O_3$—$Li_2O_3$, $B_2O_3$—$BaO$, $B_2O_3$—$ZnO$, $B_2O_3$—$La_2O_3$, $B_2O_3$—$CoO$, $B_2O_3$—$Cs_2O$, $B_2O_3$—$K_2O$, $K_2O$—$GeO_2$, $K_2O$—$SiO_2$, $K_2O$—$WO_3$, $K_2O$—$MoO_3$, $K_2O$—$Nb_2O_5$, $Na_2O$—$GeO_2$, $Na_2O$—$SiO_2$, $Na_2O$—$WO_3$, $Na_2O$—$MoO$, $Na_2O$—$Nb_2O_5$, $MoO_3$—$Cs_2O$, $MoO_3$—$Li_2O$, $MoO_3$—$WO_3$, $Cs_2O$—$SiO_2$, and/or $Cs_2O$—$Nb_2O_5$.

The sulfide may include or consist essentially of $Al_2S_3$, $Sb_2S_3$, $As_2S_3$, BaS, BeS, $Bi_2S_3$, $B_2S_3$, CdS, CaS, CeS, $Ce_2S_3$, WS, $Cr_2S_3$, CoS, $CoS_2$, $Cu_2S$, CuS, $Dy_2S_3$, $Er_2S_3$, EuS, $Gd_2S_3$, $Ga_2S_3$, GeS, $GeS_2$, $HfS_2$, $Ho_2S_3$, $In_2S$, InS, FeS, $FeS_2$, $La_2S_3$, $LaS_2$, $La_2O_2S$, PbS, $Li_2S$, MgS, MnS, HgS, $MoS_2$, $Nd_2S_3$, S, NdS, $K_2S$, $Pr_2S_3$, $Sm_2S_3$, $Sc_2S_3$, $SiS_2$, $Ag_2S$, $Na_2S$, SrS, $Tb_2S$, $Tl_2S$, $ThS_2$, $Tm_2S_3$, SnS, $SnS_2$, $TiS_2$, $WS_2$, $US_2$, $V_2S_3$, $Yb_2S_3$, $Y_2S_3$, $Y_2O_2S$, ZnS, $ZrS_2$, and/or combinations thereof.

The carbide may include or consist essentially of $CaC_2$, SiC, WC, $Fe_3C$, TiC, ZrC, VC, NbC, TaC, $Cr_3C_2$, $Mo_2C$, HfC, and/or combinations thereof.

The boride may include or consist essentially of $TiB_2$, $ZrB_2$, $HfB_2$, NbB, $NbB_2$, TaB, $TaB_2$, $CrB_2$, $Mo_2B_5$, $W_2B_5$, $Fe_2B$, FSB CoB, $Co_2B$, NiB, $Ni_2B$, $Al_3Mg_3B_{56}$, and/or combinations thereof.

The oxide may have a perovskite crystal structure ($ABO_3$).

The fluoride may include or consist essentially of $LiF_3$, $LiF_2$, $NdF_3$, $NdF_2$, NdOF, LiOFMg, $MgF_2$, $NdF_3$, $NdF_2$, NdOF, MgOFCa, $CaF_2$ $NdF_3$ $NdF_2$, NdOF, CaOFLa, $LaF_3$, $LaF_2$, $NdF_3$, $NdF_2$, NdOF, LaOFCe, $CeF_3$, $CeF_2$, $NdF_3$, $NdF_2$, NdOF, CeOFPr, $PrF_3$, $PrF_2$, $NdF_3$, $NdF_2$, NdOF, PrOFNd, $NdF_3$, $NdF_3$, $NdF_2$, NdOF, NdOFSm, $SmF_3$, $SmF_2$, $NdF_3$, $NdF_2$, NdOF, SmOFEu, $EuF_2$, $NdF_3$, $NdF_2$, NdOF, EuOF, and/or combinations thereof.

The polymer may include or consist essentially of a phenolic resin, an epoxy resin, an amide, a phosphoramide, a sulfonamide, a saturated fatty acid amide, an unsaturated fatty acid amide, and/or combinations thereof.

A thickness of the continuous dielectric coating may be less than 50 micrometers, e.g., less than 1 micrometer, or less than 200 nanometers.

The continuous dielectric coating may include a plurality of heterogeneous surface layers.

The particulates may include nanoparticles having a particle size selected from a range of 100 nm to 1000 nm.

The continuous dielectric coating may include an amorphous structure and/or a crystalline structure.

A ratio of the thickness of the dielectric coating to the diameter of the soft magnetic metallic core may be less than 1:1, e.g., less than 1:10 or less than 1:1,000.

Each particulate may have a shape of spherical, angular, needle-like, or platelet.

Each particulate may include a metal layer disposed over the dielectric coating. The metal layer may include or consist essentially of iron, cobalt, nickel, and/or alloys thereof.

The powder may have a powder flowability suitable for additive manufacturing. For example, the powder flowability may include a flow rate of at least one of greater than 50 grams per 25 seconds in a Hall flow test conducted to the ASTM B213 standard or greater than 50 grams per 5 seconds in a Carney flow test conducted to the ASTM B964 standard.

The particulates may have an avalanche angle less than or equal to 45° as measured in a rotating, transparent drum filled with a known amount of powder.

The particulates may have a unimodal particle size distribution.

The particulates comprise a multi-modal particle size distribution, e.g., a bimodal distribution. A smaller mean particle size of the particulates is selected from a range of 1 micrometer to 100 micrometers, e.g., 1 micrometer to 50 micrometers, and a larger mean particle size of the powder is selected from a range of 15 micrometers to 250 micrometers, e.g., 15 micrometers to 150 micrometers.

The powder may also include a plurality of uncoated soft magnetic particulates, with a smaller mean particle size of the powder being a mean particle size of the uncoated soft magnetic particulates and a larger mean particle size being a mean particle size of the coated particulates, the plurality of uncoated soft magnetic particulates and the coated particulates comprising a same alloy.

A ratio of the thickness of the dielectric coating to a diameter of the soft magnetic metallic core is less than 1:1, e.g., less than 1:10 or less than 1:1,000.

In another aspect, embodiments of the invention relate to a method for forming a powder, the method including forming a plurality of particulates. Each particulate is formed by forming a magnetic metallic core including a soft magnetic pure metal or alloy thereof, and forming a continuous dielectric coating on the magnetic metallic core by a conformal coating process. The powder includes the plurality of particulates. The continuous dielectric coating has a thickness from a range of 100 nanometers to 100 micrometers, includes at least one surface layer, and provides more than 90% surface coverage of the core. The particulates have a mean particle size selected from a range of 100 nanometers to 250 micrometers.

Forming the magnetic metallic core may include at least one of gas atomization, water atomization, plasma atomization, rotating electrode atomization, centrifugal atomization, spinning water atomization process (S.W.A.P.), melt spinning, quenching, attrition, milling, hydrogen reduction, electrolytic powder production, carbonyl iron process, and/or carbonyl nickel process.

The soft magnetic pure metal or alloy thereof may include or consist essentially of Fe, Co, Ni, Fe—Co, Fe—Ni, Fe—Si, FeCoSiB, amorphous magnetic materials, metal-metalloid systems (metallic glasses), and/or alloys or combinations thereof.

The conformal coating process may include formation of a native oxide by surface oxidation, atomic layer deposition (ALD), molecular layer deposition, physical vapor deposition, sol-gel, chemical vapor deposition (CVD), metal organic chemical vapor deposition (MOCVD), plasma torch synthesis, spray coating, high velocity oxygen fuel coating, arc coating, co-precipitation, epoxy coating, a supercritical $CO_2$ method, high pressure coating, and/or combinations thereof.

The conformal coating process may include forming the continuous dielectric coating by (i) functionalizing each magnetic metallic core by applying a plurality of dielectric nanoparticles to the core, and (ii) densifying the dielectric nanoparticles to form the continuous dielectric coating. Functionalizing each magnetic metallic core may include (i) rapid mixing of a plurality of the magnetic metallic cores with the plurality of dielectric nanoparticles, (ii) ball milling of the magnetic metallic cores with the dielectric nanoparticles, and/or (iii) plasma spraying of dielectric nanoparticles onto the magnetic metallic cores. The dielectric nanoparticles may include any of the materials disclosed herein for the dielectric coatings.

The continuous dielectric coating may include a first surface layer including a first dielectric material including or consisting essentially of an oxide, a nitride, a sulfide, a carbide, a boride, a fluoride, a polymer, phosphorus and/or combinations thereof.

A thickness of the continuous dielectric coating may be less than 50 micrometers, e.g., less than 1 micrometer, or less than 200 nanometers.

The continuous dielectric coating may include a plurality of heterogeneous surface layers.

The particulates may include nanoparticles having a particle size selected from a range of 100 nm to 1000 nm.

The continuous dielectric coating may include an amorphous structure and/or a crystalline structure.

A ratio of the thickness of the dielectric coating to a diameter of the soft magnetic metallic core may be less than 1:1, e.g., less than 1:10 or less than 1:1,000.

The powder may have a powder flowability suitable for additive manufacturing.

Each particulate may be milled or rolled from an approximately spherical particle shape into a flat particle shape.

In still another aspect, embodiments of the invention relate to a soft magnetic composite component including a magnetic material in a dielectric matrix. The magnetic material includes a plurality of particulates having metallic cores. Each metallic core is coated by a continuous dielectric coating covering >90% of a surface area of the metallic core. The metallic cores are electrically isolated from each other. The dielectric coatings of adjacent metallic cores are consolidated together.

A permeability of the component is selected from a range of 100-25,000.

A saturation flux density of the component may be selected from a range of 1.0 T-2.4 T.

A ratio of dielectric material to metal in the component may be selected from a range of 1:1-1:2,500.

A density of the component may be selected from a range of 90-100%.

Pores defined by the particulates may be isolated from one another.

A surface of the component may include striations having a height selected from a range of 100 nanometers to 250 µm.

In another aspect, embodiments of the invention relate to a powder including a plurality of particulates. Each particulate includes a soft magnetic metallic core coated with a continuous dielectric coating having a thickness selected from a range of 100 nanometers to 100 micrometers. The particulates have a unimodal particle size distribution with a mean particle size selected from a range of 100 nanometers to 250 micrometers.

In still another aspect, embodiments of the invention relate to a method for fabricating a soft magnetic composite component by hot isostatic pressing (HIP). The method includes providing to a HIP container a powder including a plurality of particulates, each particulate comprising a soft magnetic metallic core coated with a continuous dielectric coating comprising a dielectric material. The soft magnetic composite component is fabricated by forming consolidated material from the powder by hot isostatic pressing. A packing density of the magnetic composite component is greater than 95%, and the soft magnetic metallic cores in the magnetic composite component are electrically and magnetically isolated from each other by a continuous three-dimensional network of the dielectric material.

BRIEF DESCRIPTION OF DRAWINGS

FIGS. 11a and 11b are a schematic figure and a photograph, respectively, illustrating a binder jet processed complex shaped soft magnetic composite part placed in a HIP can filled with a refractory media, in accordance with an embodiment of the invention.

DETAILED DESCRIPTION

As used herein, a soft magnetic composite means materials that include soft magnetic powder particles surrounded by an electrically insulating layer. Some of the unique properties of these materials include: three-dimensional isotropic soft magnetic behavior, low eddy current loss, low core loss at medium and high frequencies above 200 Hz, flexible component design, and a prospect for lower weight and coil winding costs.

Disclosed herein are powders suitable for manufacturing of soft magnetic composite components, including by additive manufacturing; both the composition of the particulates and methods of manufacture thereof are addressed. Also disclosed are additive manufacturing methods for forming soft magnetic composites with reduced eddy currents.

As used herein, "additive manufacturing system" means any machine and auxiliary equipment configured to produce components by additive manufacturing.

As used herein, "soft magnetic composite" means a material manufactured by consolidating ferromagnetic powder particles, each surrounded by an electrically insulating layer and typically having an intrinsic coercivity 50 Oe, e.g., less than 12.5 Oe.

As used herein, "core" mean a single particle or an agglomeration of several particles.

Particulate Structures and Compositions

Embodiments of invention include powders suitable for forming soft magnetic composites by, e.g., additive manufacturing.

Figure 1:
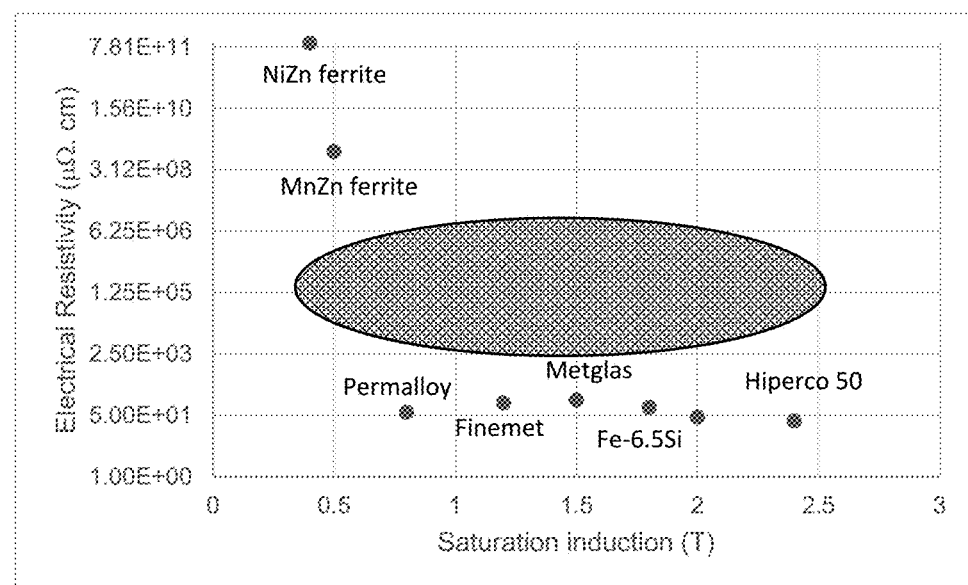
FIG. 1 is a graph illustrating electrical properties of soft magnetic composite components fabricated by the methods in accordance with embodiments of the invention.
Figure 2:
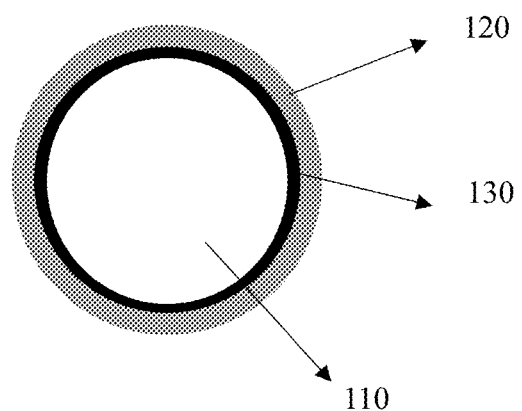
FIG. 2 is a schematic diagram illustrating a core-shell particulate structure of a dielectric shell formed on a soft magnetic core, including an interdiffusion layer formed after sintering, in accordance with an embodiment of the invention.

Referring to FIG. 2, an exemplary powder includes a plurality of particulates 100, with each particulate including a soft magnetic metallic core 110 coated with a continuous dielectric coating 120 having a thickness less 100 micrometers, e.g., less than 50 micrometers, less than 1 micrometer, or less than 200 nm, with a minimum thickness of 100 nm. The dielectric coating is preferably thick/resistive enough to electrically isolate cores and thin enough to subsequently constitute a relatively low volume fraction of consolidated soft magnetic composite material, thereby increasing magnetic saturation induction of the composite. An amorphous and/or crystalline intermediate layer 130, i.e., a magnetic-dielectric diffused layer, may be disposed between the metallic core 110 and dielectric coating 120.

The powder may have a flowability suitable for additive manufacturing, as discussed below.

The particulates may have a mean particle size selected from a range of 100 nanometers to 250 micrometers, e.g., 1 µm to 200 µm or 10 µm to 150 µm. The particulates may include a unimodal particle size distribution. If the particle diameter is greater than the domain size, magnetic domain wall movement will likely occur during magnetization reversal, resulting in generation of a high hysteresis loss. Particle size distributions with mean particle sizes below 100 micrometers are typically suitable for binder jet or selective laser sintering (SLS) additive manufacturing. Particle size distributions with mean particle sizes between 45-150 micrometers are typically suitable for direct energy deposition additive manufacturing. Unimodal particle size distributions typically offer the advantage of less processing effort and cost, and higher yield, in comparison to multi-modal particle size distributions.

The combination of metallic core and a dielectric coating (also referred to herein as "shell") enables the formation of soft magnetic composites with high resistivities, in which the metallic cores are surrounded by dielectric material, thereby improving core loss, permeability, and device efficiency.

In particular, the soft magnetic metallic core may include or consist essentially of a soft magnetic pure metal or alloy thereof, such as Fe, Co, Ni, Fe—Co, Fe—Ni, Fe—Si, FeCoSiB, amorphous magnetic materials, metal-metalloid systems (metallic glasses), or alloys or combinations thereof. These metals and alloys are soft magnetic, having relatively high permeabilities, low coercivities, and high saturation induction properties, which enable them to switch magnetization easily and with relatively low core loss in comparison to permanent, or "hard" magnetic materials. The soft magnetic metallic core may have a coercivity ranging from, for example, 0.01 Oe to 50 Oe.

In some embodiments, the continuous dielectric coating includes a first surface layer that includes or consists of a first dielectric material, such as a hydride, an oxide, a nitride, a sulfide, a carbide, a boride, a fluoride, a polymer, phosphorus, and/or combinations thereof. These materials are selected for their high dielectric constant, a property of insulating materials which enables them to electrically isolate the soft magnetic cores with very low thicknesses of dielectric between cores.

A suitable hydride is $MgH_2$, $MBH_4$ (M=Li, Ca, Mg, Na, K), $MNH_2$ (M=Li and Mg), $MBH_4+'MH_2$ (M=Li, Ca, Mg; 'M=Li, Mg, Ca), or $MNH_2+'MH_2$ (M=Li, Mg; 'M=Li), and/or combinations thereof.

A suitable oxide is $BaTiO_3$, $Al_2O_3$, $HfO_2$, $HfSiO_4$, $\alpha\text{-}TiO_2$, $\alpha\text{-}SiO_2$, $ZrO_2$, $CeO_2$, $CoO$, $Cr_2O_3$, $MgO$, $Al_2O_3$, $SnO_2$, $NiO_2$, $GaO$, $GeO_2$, $Li_2O$, $Y_2O_3$, $La_2O_3$, $ZnO$, $ZrO_2$, $WO_3$, $TiO_2$, $Sc_2O_3$, $BaO$, $Eu_2O_3$, $SiO_2$, $Cs_2O$, $MoO_3$, $Nb_2O_5$, $TeO_2$, $Bi_2O_3$, $BaO$, $SrO$, $Ta_2O_5$, copper oxides, iron oxides, iron-cobalt oxides, iron-nickel oxides, and/or combinations thereof.

The oxide may have a perovskite crystal structure ($ABO_3$).

A suitable nitride is AlN, BaN, BN, TiN, VN, CrN, and/or combinations thereof.

The continuous dielectric coating may include a second surface layer. The second surface layer may include a second dielectric material including an oxide, with the second dielectric material being different from the first dielectric material. For example, the oxide of the second dielectric material may be, a low melting point glass oxide including at least one of, e.g., $B_2O_3$, $Bi_2O_3$, PbO, $V_2O_5$, $TeO_2$, $Na_2O$, $K_2O$, $MoO_3$. and/or combinations thereof. These oxides have a low melting point in comparison to the first surface layer, e.g., $Al_2O_3$, which has a high melting point. Accordingly, using these oxides in a second surface layer may help facilitate sintering/densification/consolidation of the particles.

In some embodiments, the first surface layer may include an oxide (A), and a second surface layer may be disposed on the first surface layer and include an oxide (B). The combination (B-A) may be, e.g., $B_2O_3$—$Al_2O_3$, $B_2O_3$—$GeO_2$, $B_2O_3$—$SiO_2$, $B_2O_3$—$WO_3$, $B_2O_3$—$Cr_2O_3$, $B_2O_3$—$MoO_3$, $B_2O_3$—$Nb_2O_5$, $B_2O_3$—$Li_2O_3$, $B_2O_3$—BaO, $B_2O_3$—ZnO, $B_2O_3$—$La_2O_3$, $B_2O_3$—CoO, $B_2O_3$—$Cs_2O$, $B_2O_3$—$K_2O$, $K_2O$—$GeO_2$, $K_2O$—$SiO_2$, $K_2O$—$WO_3$, $K_2O$—$MoO_3$, $K_2O$—$Nb_2O_5$, $Na_2O$—$GeO_2$, $Na_2O$—$SiO_2$, $Na_2O$—$WO_3$, $Na_2O$—MoO, $Na_2O$—$Nb_2O_5$, $MoO_3$—$Cs_2O$, $MoO_3$—$Li_2O$, $MoO_3$—$WO_3$, $Cs_2O$—$SiO_2$, $Cs_2O$—$Nb_2O_5$, $B_2O_3$—$Al_2O_3$, $B_2O_3$—$GeO_2$, $B_2O_3$-$SaO_2$, $B_2O_3$—$WO_3$, $B_2O_3$—$Cr_2O_3$, $B_2O_3$—$MoO_3$, $B_2O_3$—$Nb_2O_5$, $B_2O_3$—$Li_2O_3$, $B_2O_3$—BaO, $B_2O_3$—ZnO, $B_2O_3$—$La_2O_3$, $B_2O_3$—CoO, $B_2O_3$—$Cs_2O$, $B_2O_3$—$K_2O$, $K_2O$—$GeO_2$, $K_2O$—$SiO_2$, $K_2O$—$WO_3$, $K_2O$—$MoO_3$, $K_2O$—$Nb_2O_5$, $Na_2O$—$GeO_2$, $Na_2O$—$SiO_2$, $Na_2O$—$WO_3$, $Na_2O$—MoO, $Na_2O$—$Nb_2O_5$, $MoO_3$—$Cs_2O$, $MoO_3$—$Li_2O$, $MoO_3$—$WO_3$, $Cs_2O$—$SiO_2$, or $Cs_2O$—$Nb_2O_5$. Suitable combinations of oxides may be chosen based on their ability to adhere to one another; for example based upon similar lattice parameters, or the ability to form inter-diffusion layers with a range of chemical composition and stoichiometry.

A suitable sulfide is $Al_2S_3$, $Sb_2S_3$, $As_2S_3$, BaS, BeS, $Bi_2S_3$, $B_2S_3$, CdS, CaS, CeS, $Ce_2S_3$, WS, $Cr_2S_3$, CoS, $CoS_2$, $Cu_2S$, CuS, $Dy_2S_3$, $Er_2S_3$, EuS, $Gd_2S_3$, $Ga_2S_3$, GeS, $GeS_2$, $HfS_2$, $Ho_2S_3$, $In_2S$, InS, FeS, $FeS_2$, $La_2S_3$, $LaS_2$, $La_2O_2S$, PbS, $Li_2S$, MgS, MnS, HgS, $MoS_2$, $Nd_2S_3$, S, NdS, $K_2S$, $Pr_2S_3$, $Sm_2S_3$, $Sc_2S_3$, $SiS_2$, $Ag_2S$, $Na_2S$, SrS, $Tb_2S$, $Tl_2S$, $ThS_2$, $Tm_2S_3$, SnS, $SnS_2$, $TiS_2$, $WS_2$, $US_2$, $V_2S_3$, $Yb_2S_3$, $Y_2S_3$, $Y_2O_2S$, ZnS, $ZrS_2$, and/or combinations thereof.

A suitable carbide is $CaC_2$, SiC, WC, $Fe_3C$, TiC, ZrC, VC, NbC, TaC, $Cr_3C_2$, $Mo_2C$, HfC, and/or combinations thereof.

A suitable boride is of $TiB_2$, $ZrB_2$, $HfB_2$, $VB_2$, NbB, TaB, $TaB_2$, $CrB_2$, $Mo_2B_5$, $W_2B_5$, $Fe_2B$, FeB CoB, $Co_2B$ NiB, $Ni_2B$, $Al_3Mg_3B_{56}$, and/or combinations thereof.

A suitable fluoride is $LiF_3$,$LiF_2$, $NdF_3$, $NdF_2$, NdOF, LiOFMg, $MgF_2$, $NdF_3$, $NdF_2$, NdOF, MgOFCa, $CaF_2$ $NdF_3$ $NdF_2$, NdOF, CaOFLa, $LaF_3$, $LaF_2$, $NdF_3$, $NdF_2$, NdOF, LaOFCe, $CeF_3$, $CeF_2$, $NdF_3$, $NdF_2$, NdOF, CeOFPr, $PrF_3$, $PrF_2$, $NdF_3$, $NdF_2$, NdOF, PrOFNd, $NdF_3$, $NdF_3$, $NdF_2$, NdOF, NdOFSm, $SmF_3$, $SmF_2$, $NdF_3$, $NdF_2$, NdOF, SmOFEu, $EuF_2$, $NdF_3$, $NdF_2$, NdOF, EuOF, and/or combinations thereof.

A suitable polymer is, e.g., a phenolic resin, an epoxy resin, an amide, a phosphoramide, a sulfonamide, a saturated fatty acid amide, an unsaturated fatty acid amide, and/or combinations thereof.

In some embodiments, the continuous dielectric coating may include a plurality of heterogeneous surface layers. Each of the surface layers may include an oxide, a nitride, a sulfide, a carbide, a boride, a fluoride, a polymer, phosphorus, and/or combinations thereof, as described above.

A first layer may function as an insulator and a second layer may function as a mechanical integrator.

The continuous dielectric coating may have an amorphous structure or a crystalline structure.

The particulates may include nanoparticles having a particle size ranging from 100 nm to 1000 nm.

A ratio of a thickness of the dielectric coating to a diameter of the magnetic metallic core may be less than 1:1. For example, a diameter of the metallic core may be 1 micrometer and the dielectric coating may have a thickness of 1 micrometer. A ratio of a thickness of the dielectric coating to a diameter of the magnetic metallic core may be less than 1:10. For example, a diameter of the metallic core may be 1 micrometer and the dielectric coating may have a thickness of 100 nanometers. An advantage of such ratios is the reduction of the volume fraction of dielectric material within the composite, thus increasing saturation induction and other soft magnetic properties. The dielectric coating preferably has a thickness of at least 100 nanometers to enable full electrical isolation of the core soft magnetic material.

A ratio of a thickness of the dielectric coating to a diameter of the magnetic metallic core may be less than 1:1,000. For example, a diameter of the metallic core may be 100 micrometers and the dielectric coating may have a thickness of 100 nanometers. An advantage of such a low ratio is the further reduction of the volume fraction of dielectric material within the composite, which further increases saturation induction and other soft magnetic properties. However, below 100 nanometers, the dielectric coating may not fully electrically insulate the substrate particles in consolidated form.

The surface coverage of the dielectric coating is conformal and may cover more than 90% of the surface area of the metallic core.

Each particulate may have a shape of spherical, angular, needle-like, or platelet/flakes. The advantage of spherical powders is in packing density and flowability for spreading and feeding powders within additive manufacturing techniques. The advantage of non-spherical powders such as angular, needle-like, or platelet are the lower cost of production and higher particle-to-particle contact, which enhances further the green and sintered density of the additively manufactured parts along with magnetic and mechanical responses. A combination of spherical and platelets/flakes and/or needle-like and/or irregular particles also helps increase the density of the additively manufactured parts.

The coating is preferably strongly bonded to the core, i.e., a strong interfacial bond is formed by chemical or physical bonding. In general, chemical bonding is preferred such that the dielectric forms a covalent or ionic bond to the core metallic material, since the adherence of the coating is more robust as compared to physical attachment via van der Waals attractive forces.

In an embodiment, the core may have a particle size ranging from 10 nm to several 100 micrometers. For example, a suitable core may be, e.g., Fe65-Co35, inert gas atomized powder with a particle size of less than 45 μm. The shell may be amorphous aluminum oxide of approximately 100-1000 nm thickness formed by atomic layer deposition (ALD).

Each particulate may include a metal layer disposed over the dielectric coating. The metal or metal alloy layer may include or consist essentially of iron, cobalt, nickel, and/or alloys thereof. A suitable metal is one that can diffuse easily at the sintering temperature range, e.g., greater than 1000° C., and can offer good mechanical responses. Ideally, the metal or alloy is ferromagnetic with a high magnetic saturation induction, thereby increasing an average saturation of a composite formed from the particulate.

The powder may have a powder flowability suitable for additive manufacturing. For example, the powder flowability may be a flow rate of at least one of greater than 50 grams per 25 seconds in a Hall flow test conducted to the ASTM B213 standard. In some embodiments, the powder flowability is greater than 50 grams per 5 seconds in a Carney flow test conducted to the ASTM B964 standard.

Moreover, as another indicator of powder flowability, the particulates may have an avalanche angle less than or equal to 45° as measured in a rotating, transparent drum filled with a known amount of powder.

Such powder flowabilities may be achieved as follows. The size of the particulates is selected to generally avoid very small particles which increase friction. In some embodiments, a shape of the particulates is generally spherical, as angular or spongy-type powders may have many interface points, thereby reducing flowability. Furthermore, as moisture content affects flow, a moisture content may preferably be below 50-60% relative humidity. Finally, surface coatings of inorganic materials can improve flowability, since they have inherently lower surface friction.

Fabrication of Powder

The powder including a plurality of particulates, as described above, may be fabricated as follows. First, the magnetic metallic cores of the particulates are formed. The magnetic metallic cores include a soft magnetic pure metal or an alloy thereof, and may be formed by methods known to one of skill in the art, e.g., gas atomization, water atomization, plasma atomization, rotating electrode, centrifugal atomization, spinning water atomization process (S.W.A.P.), melt spinning, quenching, attrition, milling, hydrogen reduction, electrolysis, carbonyl iron, or carbonyl nickel processes. The cores may include a plurality of particles of, e.g., Fe, Co, Ni, Fe—Co, Fe—Ni, Fe—Si, FeCoSiB, amorphous magnetic materials, metal-metalloid systems (metallic glasses), alloys and/or combinations thereof. The particles may have a mean size ranging from 100 nm to 250 micrometers, e.g., 0.05 micrometers to 250 micrometers, or 5 micrometers to 200 micrometers or 10 micrometers to 100 micrometers. In some embodiments, each core may include a plurality of particles.

In one embodiment, Fe65-Co35 powder is manufactured by vacuum induction melt gas atomization using argon, nitrogen, or helium gas as the atomization medium. This fabrication method produces approximately spherical, uniform particles with a mean size ranging from 100 nanometers to 250 micrometers or more. Such particles are suitable for additive manufacturing because, e.g., their sphericity and uniformity allow them to be spread in additive manufacturing powder bed fusion techniques. Moreover, their lack of internal porosity allows high-density components to be fabricated. Finally, the purity of the atomization gas leads to clean particle surfaces, devoid of oxides or contaminating particles or layers, enabling such powders to be coated consistently with dielectric material using a range of chemical and physical deposition methods.

A continuous dielectric coating may be formed on the magnetic metallic cores by a conformal coating process, also known as surface functionalization. The continuous dielectric coating may have a thickness less than or equal to 100 micrometers, e.g., 100 nanometers to 100 micrometers, include at least one surface layer, and provide >90% surface coverage of the core.

The coating process may be any mechanism for forming a conformal, strongly bonded thin/nanolayer coating on the core surface. Suitable conformal coating processes include, e.g., formation of a native oxide by surface oxidation, atomic layer deposition (ALD), molecular layer deposition, physical vapor deposition, sol-gel, chemical vapor deposition (CVD), metal organic chemical vapor deposition (MOCVD), plasma torch synthesis, spray forming or coating, high velocity oxygen fuel coating, arc coating, co-precipitation, epoxy coating, a supercritical $CO_2$ method, high pressure coating, and combinations thereof.

In one embodiment, the surfaces of Fe65-Co35 powders with particle size distribution less than 45 micrometers are coated with amorphous aluminum oxyhydroxide or oxide using atomic layer deposition (ALD). An advantage of ALD is that it yields fully conformal surface layers, with thicknesses that can be easily controlled due to the layer-by-layer, self-limiting sequential chemical reaction (separate saturating gas-solid reaction) process. The ALD process may be performed within a fluidized bed, rotating drum, blender, or other device that continuously moves or agitates the powder particles so that they are conformally coated. Particle ALD appropriate for the fabrication of soft magnetic composites described herein may be performed using commercially-available equipment at ALD Nanosolutions, Inc. or an equivalent provider.

Figure 3:
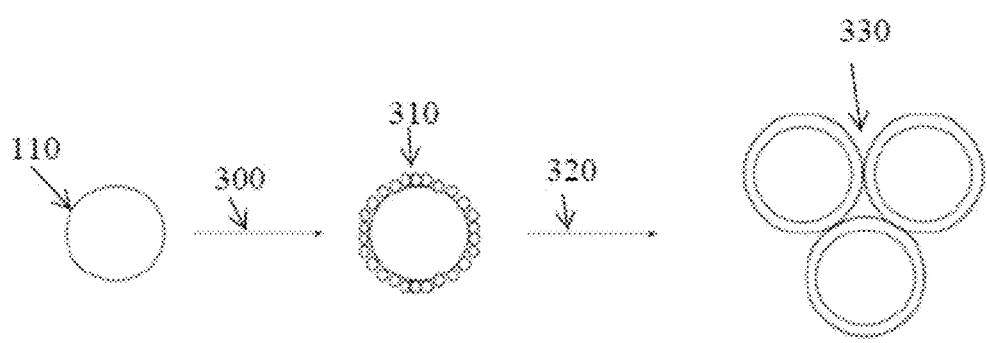
FIG. 3 is a schematic diagram illustrating the formation of soft magnetic metallic cores coated by a continuous dielectric coating, wherein the dielectric coating is formed by consolidating a coating of dielectric nanoparticles, in accordance with an embodiment of the invention.

Referring to FIG. 3, in some embodiments, forming the continuous dielectric coating includes functionalizing core material (soft magnetic metal or alloy) including a plurality of magnetic metallic cores 110 (with diameter of, e.g., 10-250 µm) by applying 300 a plurality of dielectric nanoparticles (with diameter of e.g., 100-5000 nm) to the core to form surface-functionalized particulates 310. The dielectric nanoparticles may be densified to form the continuous dielectric coating, e.g., in the same densification process used to densify consolidated material made from the powder by additive manufacturing.

Functionalizing each magnetic metallic core may include, e.g., (i) rapid mixing of a plurality of the magnetic metallic cores with the plurality of dielectric nanoparticles, (ii) ball milling of the magnetic metallic cores with the dielectric nanoparticles, and/or (iii) plasma spraying of dielectric nanoparticles onto the magnetic metallic cores.

After functionalization of the metallic core, a powder including a plurality of surface-functionalized particulates may be processed 320 by additive manufacturing, followed by consolidation/densification to form a core-shell soft magnetic composite 330.

The dielectric nanoparticles may be formed from any of the materials disclosed herein for the dielectric coatings.

Suitable compositions for the dielectric coating are described above. A thickness of the coating may range from 100 nm to 100 micrometers, e.g., 100 nm to 200 nm. Thinner coatings may help to improve the permeability and magnetic material volume percentage, while thicker coatings may help to improve the particle-particle eddy current losses and mechanical responses of the finished parts.

The coating may be an amorphous or crystalline dielectric. Amorphous coatings are generally preferred as they are more reactive, or catalytic, meaning that during the consolidation or densification phase of forming the soft magnetic composite, a stronger inter-particle bond may be formed. This has a beneficial influence on overall component strength, as well as ability to achieve greater densification of the component during sintering.

In another embodiment, the coating may be an in-situ thin oxide coating formed during the atomization process in which the core is formed. This may be achieved by including a fraction (<50%) of oxygen entrained in the high-pressure gas flow within an inert gas atomizer to self-passivate the soft magnetic material droplets as they freeze. Particles produced by such a mechanism are highly spherical and free of agglomerates, or satellites. Alternatively, self-passivation may be achieved using water gas atomization; however this has the disadvantage of producing angular or sponge-like powder shapes, which is typically detrimental to spreadability in the additive manufacturing process and powder apparent density.

The powder preferably has a unimodal particle size distribution, which is attained by screening and classifying as-atomized powders to remove large- and small-diameter particles, respectively, within the desired particle size range. In some embodiments, the powder may have a multi-modal particle size distribution.

In some embodiments, the particulates may be milled or rolled from an approximately spherical particle shape into a flat particle shape.

Additive Manufacturing Methods Using Novel Powders

The powders described above, e.g., powders that include a plurality of particulates, with each particulate having a soft magnetic metallic core coated with a continuous dielectric coating with a thickness of at least 100 nanometers and no more than 100 micrometers, may be utilized in additive manufacturing processes to fabricate soft magnetic composite components, including components with highly complex shapes.

Accordingly, in an embodiment, a component may be made from the powder by additive manufacturing. Providing the powder to the additive manufacturing system may include forming the powder as discussed above. Alternatively, the powder may be provided to the additive manufacturing system by a user obtaining the powder from a manufacturer; the user may subsequently perform an additive manufacturing step with the powder.

In some embodiments, the powder may have a bimodal particle size distribution, with a smaller mean particle size of the powder ranging from 1 micrometer to 100 micrometers, e.g., 1 micrometer to 50 micrometers, and a larger mean particle size ranging from 15 micrometers to 250 micrometers, e.g., 15 micrometers to 150 micrometers. These particle sizes are selected to maximize the packing density of the powder in a powder bed additive manufacturing system, therefore facilitating the post-processing sintering, or densification, step.

In some embodiments, the powder may also include a plurality of uncoated soft magnetic particulates, with a smaller mean particle size of the powder being a mean particle size of the uncoated soft magnetic particulates and a larger mean particle size being a mean particle size of the coated particulates, with, for example, the uncoated soft magnetic particulates in the 1-60 vol. % range and the coated particulates in the 50-99 vol. % range including same alloy. The uncoated particles within the plurality of coated particles can aid in the sintering step, by filling the interstitial spaces or voids between coated particles, while avoiding further dilution of the overall saturation induction of the composite, since no further dielectric material is added to the volume.

Suitable additive manufacturing methods may be any of the seven categories of additive manufacturing identified by ASTM, i.e., Binder Jetting, Directed Energy Deposition, Mask-Image-Projection-Based Stereolithography, Material Extrusion, Material Jetting, Powder Bed Fusion, and Sheet Lamination, as defined in STM F2792-12a, published by the ASTM Committee F42 on Additive Manufacturing Technologies. Moreover, derivatives and combinations may be used. A suitable additive manufacturing method may include fabrication with nanoparticles, such as with a nanoparticle additive manufacturing system, such as NanoParticle Jetting.

In one embodiment, the soft magnetic composite component or article is fabricated in a binder jet additive manufacturing system, such as an ExOne Innovent system, using Fe65-Co35 powder of particle size distribution below 45 micrometers and coated with 100 nm of amorphous aluminum oxide. The particles are bound together using conventional, commercially available organic binder fluid (e.g., available from ExOne Inc.). This method has the advantage of maintaining a relatively low temperature during the fabrication of complex-shaped components, therefore maintaining the integrity of the core-shell structure in the solid state.

After the component is fabricated by additive manufacturing, the component may be densified to form a high density magnetic composite component. Suitable densification methods include high temperature sintering, hot isostatic pressing (HIP), densification via crucible compaction process by canning and sealing the soft magnetic composite green body component along with microbeads or particles of ceramic material followed by HIP'ing, hot pressing, sintering, compaction, cold isostatic pressing, spark plasma sintering, direct current sintering, and/or microwave sintering. Generally, high temperature sintering may be performed with any type of heating, e.g., microwave, IR, conventional sintering, etc. In some embodiments, high temperature sintering may be followed by hot isostatic pressing. Considerations include sintering time, temperature, reaction gases, inert gases, and other parameters.

In one embodiment, Fe65-Co35 powder of particle size distribution below 45 micrometers and coated with 100 nm of amorphous aluminum oxide may be sintered using direct current sintering at 1000-1300° C. and 20-100 MPa uniaxial pressure to achieve over 99% dense component.

In one embodiment, a component is fabricated by binder jet additive manufacturing from Fe65-Co35 powder of particle size distribution below 45 micrometers and coated with 100 nm of amorphous aluminum oxide; this component may subsequently be cured in air at 150-200° C. to remove organic binder and then sintered in a vacuum furnace (or argon or other atmosphere) at 1100-1450° C. for 2 or more hours.

After the additive manufacturing and optional densification steps, the magnetic composite component has a porosity of less than 5%. The advantage of such low porosity is to maximize the magnetic responses of the component or device fabricated from the soft magnetic material, since air gaps deteriorate magnetic and mechanical properties of the device. The pores may be isolated, which enables the component to be further densified using hot isostatic pressing or another densification method.

In some embodiments, the magnetic composite component has a high tensile breaking strength, e.g., breaking strength of greater than 150 MPa. This is attained by sufficient densification of the material (i.e., low porosity), and forming strong adherence of the dielectric layers between particles to each other during the sintering and densification process. High strength is desirable in many applications of electromagnetic devices, specifically in rotating components such as motor or generator rotors.

The magnetic composite component includes the dielectric material of the continuous dielectric coating, i.e., the dielectric material of the powder does not decompose nor does it lose conformality to the particulates during additive manufacturing and densification steps.

Soft Magnetic Component Made by Additive Manufacturing with Novel Powders

The soft magnetic component fabricated by additive manufacturing and subsequent post-processing steps from the novel powders includes consolidated, soft magnetic particles surrounded by a three-dimensional, interconnected film or continuous network of electrically insulating (i.e., highly dielectric) material.

The microstructure in two-dimensional view (e.g., via optical or electron microscopy) is characterized by continuously connected prior-particle boundaries of approximately twice the thickness of the original dielectric coating, interspersed by grains of soft magnetic material. See, e.g., the Examples described below.

The soft magnetic grains of the consolidated material are approximately equivalent in size to the feedstock particle sizes since the material does not coarsen significantly during sintering. The dielectric layers prevent interdiffusion between isolated soft magnetic material. For example, for unimodal particle size distribution feedstock the consolidated material has approximately equiaxed grains. Alternatively, for a bimodal powder distribution, the component grain sizes are also bimodally distributed.

The desired magnetic properties of the soft magnetic component include magnetic isotropy, high electrical resistivity, high permeability, high saturation, low coercivity, low core loss at medium to high frequency.

Magnetic composites can be printed using additive manufacturing into components with high geometric complexity, including internal features for more efficient flux pathways, and for example, rounded corners and edges which increases the efficiency of electrical coil winding.

Functionalization of powders with a thin dielectric (nanometers thick continuous coating) allows higher metallic volume fraction (increased fill factor) and hence superior magnetic saturation induction, lower coercivity, and high permeability.

Strong adherence of the coating to the core via chemical bonding permits high temperature sintering without film delamination or breakdown, in turn providing greater mechanical integrity and strength due to high density.

In some embodiments, a soft magnetic composite component includes a magnetic material in a dielectric matrix, with (i) the magnetic material including a plurality of particulates comprising metallic cores, (ii) each metallic core being coated by a continuous dielectric coating covering >90% of a surface area of the metallic core, (iii) the metallic cores being electrically isolated from each other, and (iv) the dielectric coatings of adjacent metallic cores being consolidated together.

The permeability of the component may range from 100 to 25,000, e.g., 500 to 1500. The permeability is chosen to be maximized for highest sensitivity and response to magnetic fields.

A saturation flux density of the component may range from 1.0 T-2.4 T. The saturation flux density is selected to be as high as possible, and as close as possible to the corresponding fully dense, pure soft magnetic material (i.e., without the dielectric material coating).

A ratio of dielectric material to metal in the component may range from 1:1-1:2,500, e.g., 1:100-1:1,000. The ratio may be selected to be as small as possible, while maintaining at least 100 nm of coating, to maximize the volume fill factor of soft magnetic material in the composite.

A density of the component may range from 90-100%, e.g., 95%-100%. The density is selected to be as close to 100% as possible so as to minimize magnetic loss-inducing air gaps in the composite.

The pores defined by the particulates may be isolated from one another.

A surface of the component may include striations having a height selected from a range of 100 nanometers to 250 μm. These striations may be formed during fabrication of the component by an additive manufacturing method.

The following table indicates parameters characterizing soft magnetic particulates and components formed in accordance with embodiments of the invention.

| Parameter | Unit | Minimum | Typical | Maximum |
| --- | --- | --- | --- | --- |
| Mean Particle size | μm | 0.1 | 25-90 | 250 |
| Coating thickness | μm | 0.1 | 0.1-2.0 | 100 |
| Electrical resistivity | μΩ-m | 0.6 | 100 | 10,000 |
| D.C. Permeability | n/a | 100 | 1,000 | 25,000 |
| Saturation Induction | T | 0.5 | 2 | 2.4 |
| AC core loss at 400 Hz and 1.5 T | W/kg | 5 | 20 | 100 |
| AC core loss at 1000 Hz and 1.5 T | W/kg | 15 | 60 | 300 |
| Coating dielectric constant K | n/a | 3.9 | 9 | 2000 |
| Vol. % of magnetic material | % | 75 | 95 | 99 |
| Packing density | % | 90% | 95% | 99.99% |
| Tensile Strength | MPa | 75 | 200 | 700 |

Examples

Figure 4:
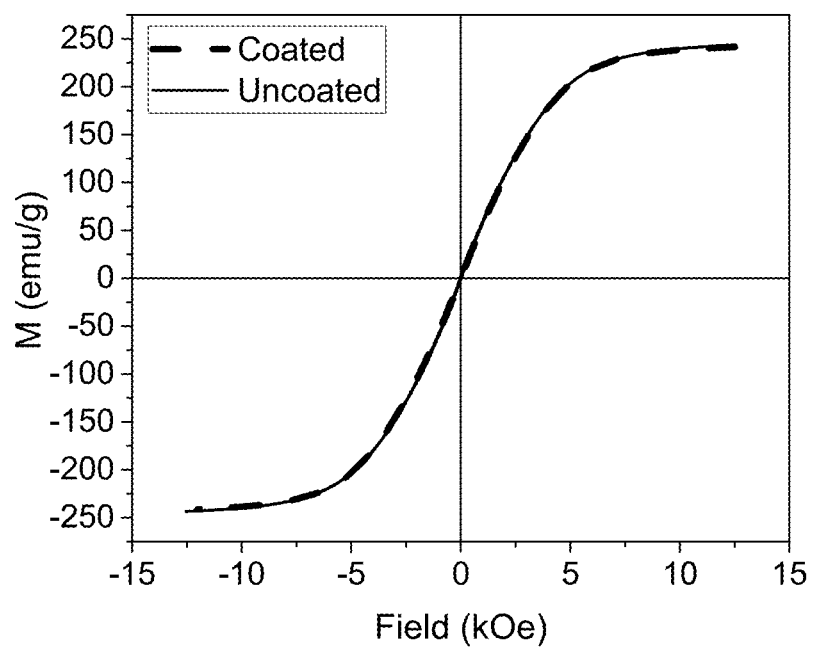
FIG. 4 is a graph illustrating a difference in saturation magnetization of a Fe-35Co soft magnetic alloy in particulate form and the saturation magnetization of the same Fe-35Co alloy coated with amorphous aluminum oxide using atomic layer deposition, in accordance with an embodiment of the invention.

Referring to FIG. 4, a graph illustrates saturation magnetization of a Fe-35Co soft magnetic alloy in particulate form, with particle size distribution of 0-45 μm ("uncoated" solid curve), in comparison to saturation magnetization of the same Fe-35Co alloy in particulate form coated with amorphous aluminum oxyhydroxide or oxide using atomic layer deposition ("coated" dashed curve), in accordance with an embodiment of the invention. The difference in saturation magnetization between the coated and uncoated powders is approximately 1%.

Figures 5A, 5B, 5C, 5D, 5E:
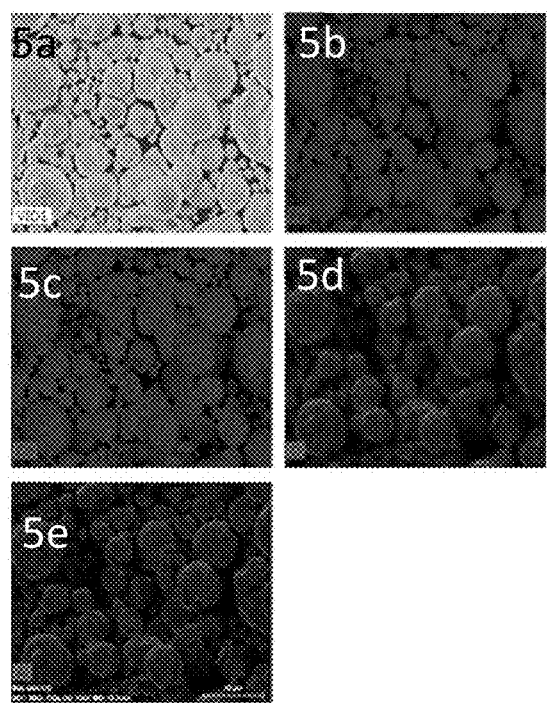
FIGS. 5a-5e are electron dispersive spectroscopy (EDS) images of Fe-35Co soft magnetic alloy formed from particles coated with amorphous aluminum oxide, in accordance with embodiments of the invention.

Referring to FIG. 5*a*, an electron dispersive spectroscopy (EDS) image illustrates Fe-35Co soft magnetic alloy in particulate form coated with amorphous aluminum oxide by atomic layer deposition (ALD), with particle size distribution of 0-45 μm. The image confirms the uniformity of the formation of particles including metallic cores and dielectric shells, in accordance with embodiments of the invention. Various images correspond to signals from different chemical elements, with each particle showing conformal consistency of the chemical constituents Fe (FIG. 5*b*), Co (FIG. 5*c*), O (FIG. 5*d*), and Al (FIG. 5*e*).

Figures 6A, 6B, 6C, 6D, 6E, 6F, 6G, 6H, 6I, 6J, 6K, 6L:
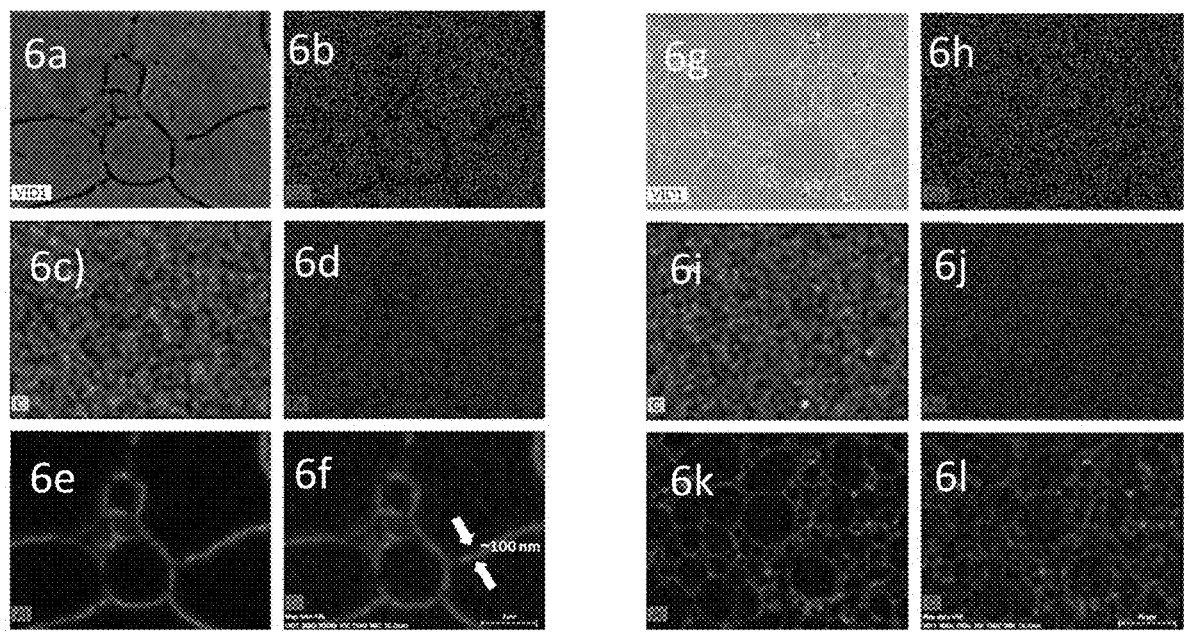
FIGS. 6a-6l are electron dispersive spectroscopy (EDS) images of Fe-35Co soft magnetic alloy formed from particles coated with amorphous aluminum oxide, in accordance with embodiments of the invention.

Referring to FIGS. 6*a* and 6*g*, electron dispersive spectroscopy (EDS) images illustrate a Fe-35Co soft magnetic alloy formed from metallic cores coated with amorphous aluminum oxide by atomic layer deposition (ALD), following consolidation of the particulates into solid component form, via densification under pressure of 30-100 MPa and temperature of 1100-1300° C., in accordance with embodiments of the invention. Additional images correspond to signals from different chemical elements Fe (FIGS. 6*d* and 6*j*), Co (FIGS. 6*b* and 6*h*), Al (FIGS. 6*e* and 6*k*), and 0 (FIGS. 6*f* and 6*l*). The soft magnetic particles of Fe-35Co are isolated in a three-dimensional network of dielectric material $Al_2O_3$, with the thickness of dielectric between each particle being approximately 100 nm.

Figure 7A:
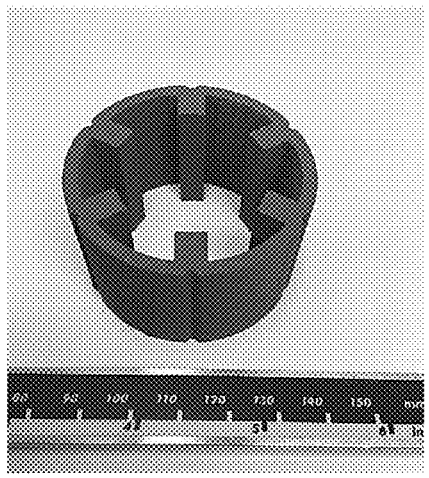
FIGS. 7a and 7b are photographs of examples of soft magnetic composite components fabricated by binder jet additive manufacturing, in accordance with embodiments of the invention.
Figure 7B:
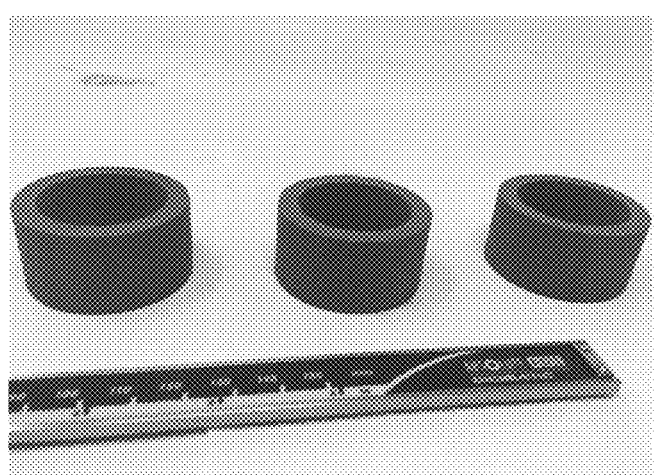

Referring to FIGS. 7a and 7b, two photographs illustrate examples of soft magnetic composite components fabricated by binder jet additive manufacturing, in accordance with embodiments of the invention. The components are fabricated into near-net shape without the need for tooling, allowing complex, three-dimensional shapes to be fabricated.

Figure 8A:
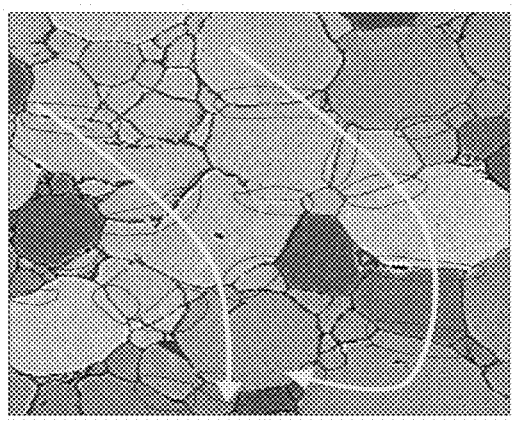
FIGS. 8a and 8b are scanning electron microscope (SEM) micrographs of a component formed of Fe—Co soft magnetic alloy coated with different thicknesses of amorphous aluminum oxide, in accordance with an embodiment of the invention.
Figure 8B:
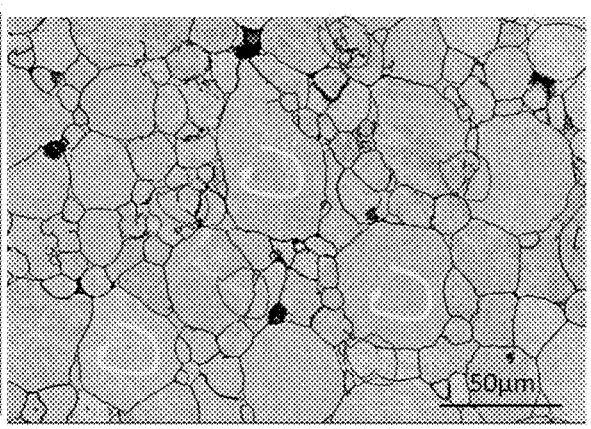

Referring to FIGS. 8a and 8b, SEM micrographs are provided of a component formed of Fe—Co soft magnetic alloy coated with two different amorphous aluminum oxide thickness by atomic layer deposition (ALD), after additive manufacturing by binder jet, curing, and densification by sintering in argon atmosphere at 1100-1400° C. for 2-4 hours, in accordance with an embodiment of the invention. FIG. 8a is a micrograph showing an example a component formed from particulates with an aluminum oxide coating of less than 100 nm that can be seen as dark lines between the soft magnetic particles. One can see that in this case, the insulation coating becomes discontinuous, leading to an uninterrupted electrical pathway between the soft magnetic Fe—Co particles. The circles indicate regions of coating discontinuity, while the arrows indicate potential inter-particle electrical pathway between the metallic particles due to insulation coating discontinuity. FIG. 8b is a micrograph showing consolidated material with greater than 100 nm aluminum oxide coating. In this case, the coating is continuous and the soft magnetic particles are electrically and physically isolated by the dielectric layers, which can be seen as dark lines. The circles indicate regions of coating discontinuity, while the arrows indicate intra-particle electrical pathway due to existence of insulation coating on most of the particles. The achievement of a continuous coating after high temperature and/or high pressure consolidation is important for reducing the inter-particle eddy current losses at higher frequencies. The consolidated parts may be subject to further heat treatment in the 600-1200° C. temperature range in dry hydrogen or high vacuum (at pressures less than $10^{-2}$ torr) or in argon atmosphere in order to improve the AC and DC magnetic properties.

Figure 9:
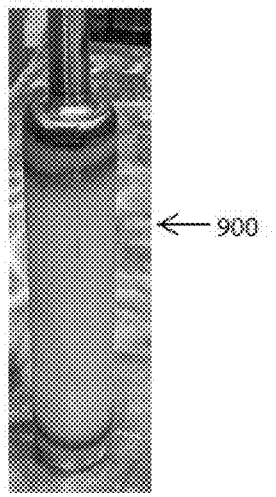
FIG. 9 is a photograph of a sealed hot isostatic pressing (HIP) can/tube, suitable for use with embodiments of the invention.

A complex shaped component may be manufactured from the coated powder materials by the use of controlled pressure and temperature. Suitable densification methods include hot isostatic pressing (HIP) As shown in FIG. 9, a HIP container/can 900 may be filled with coated metallic alloy (for example, Fe—Co, Fe—Ni, Fe—Si based alloy crystalline or amorphous powder materials) powders and the HIP container/can evacuated/outgassed to remove moisture and oxygen content from the coated powder feedstock. The required vacuum level is in the range of $10^{-3}$ torr or more preferably $10^{-5}$ torr. After reaching the required vacuum level, the HIP container/can may be sealed under vacuum using a torch. The sealed HIP can may then be pressurized in a HIP furnace at pressure between 20 MPa to 500 MPa and temperature between 900° C. to 1400° C. to achieve high packing density greater than 95%.

Figure 10:
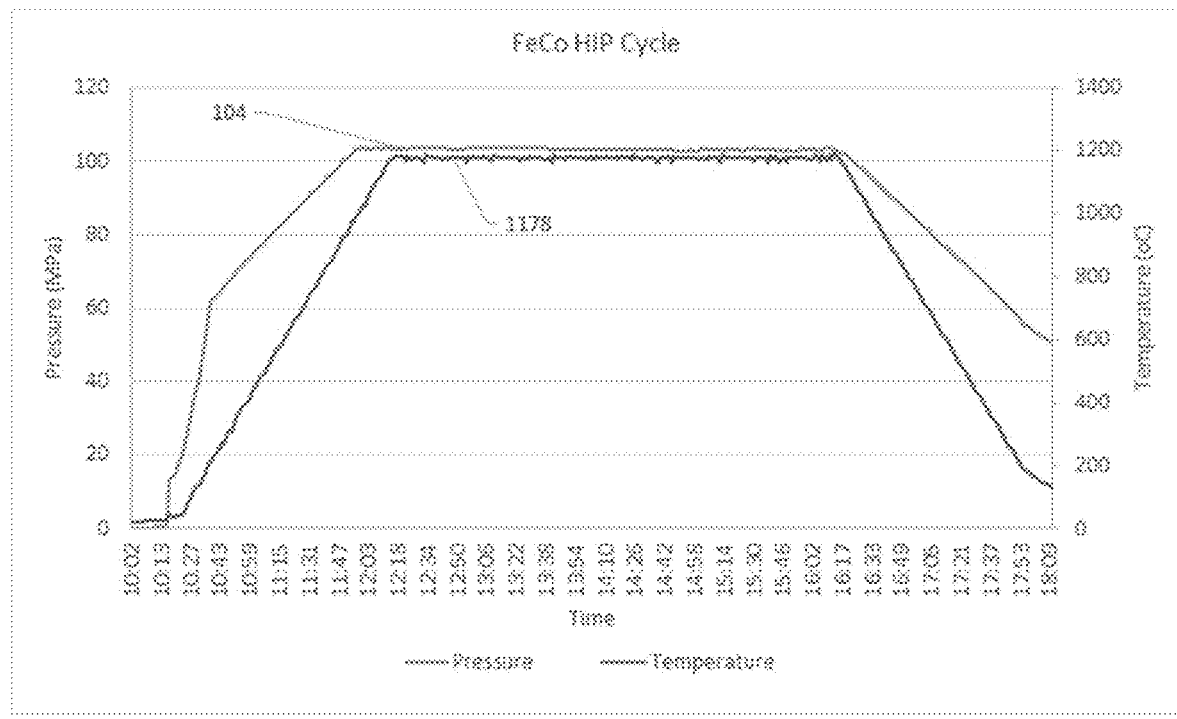
FIG. 10 is a graph of an exemplary pressure—temperature HIP profile suitable for use with embodiments of the invention.

FIG. 10 is an example of an experimental temperature—pressure HIP profile as a function of time for making samples with >99% density. The top profile 104 indicates the pressure, while the bottom profile 1178 indicates the temperature. The figure indicates a pressure of 104 MPa and temperature of 1178° C. has been maintained for about 4 hrs. to achieve a consolidated sample with >99% density.

Referring to FIGS. 11a and 11b, in another exemplary process in accordance with an embodiment of the invention, a binder jet processed complex shaped soft magnetic composite specimen 1100 is placed inside a HIP container 900 filled with a refractory powder (for example $Al_2O_3$, $ZrO_2$, $SiO_2$ and/or combinations thereof) as a consolidating medium. The resultant assembly is placed and loaded in a HIP unit. The pressure is varied between 20 MPa and 500 MPa and temperature is varied between 900° C. to 1400° C. to achieve packing density greater than 95%, for example as shown in FIG. 10. The binder jet specimen is heated in the vacuum to a temperature sufficient to burn off binders before the specimen is placed in the HIP can filled with refractory powders. The temperature is then raised, and a pressing load is applied to produce deformation of the refractory metal powders and the deformation continues until the composite specimen densifies to greater than 99%, locking the specimen geometry in place.

The consolidated HIP samples are then heat treated in vacuum at preferably below $10^{-2}$ torr pressure or in dry hydrogen atmosphere with dew point of –40° C. or lower to achieve desired magnetic responses. The heat treatment is done in between 600° C. to 1200° C. for about 30 minutes to about 6 hours with a cooling ramp rate in between 50° C./hour to 300° C./hour. This heat treatment helps in phase transformation along with stress relieving and improves the permeability, induction, and core loss responses.

Figure 12:
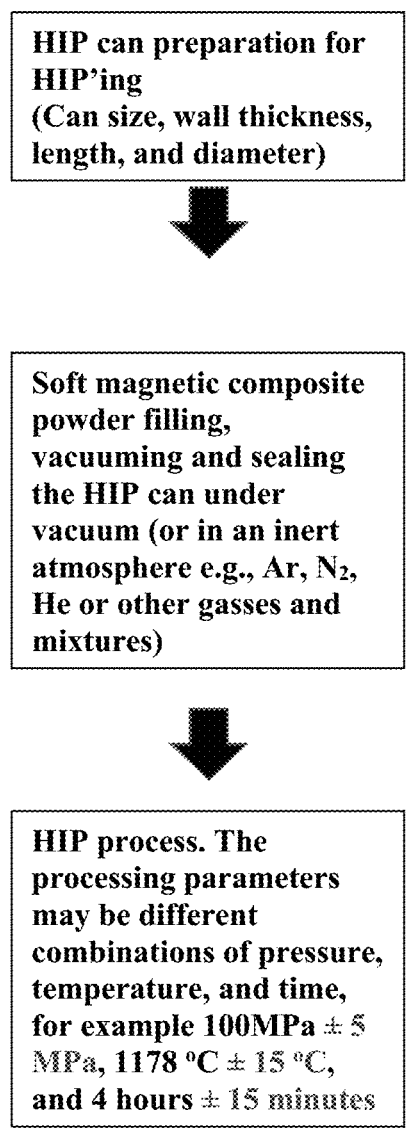
FIG. 12 is a flow chart illustrating a hot isostatic pressing (HIP) process, in accordance with an embodiment of the invention.

Referring to FIG. 12, the hot isostatic pressing processes described above can be summarized as follows:
1) Preparing a HIP can for HIP'ing;
2) Filling the HIP can with a soft magnetic composite powder, vacuuming and sealing the HIP can under vacuum or in an inert atmosphere; and
3) Performing the HIP process with appropriate pressure, temperature, and time.

While the present invention has been described herein in detail in relation to one or more preferred embodiments, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof.

What is claimed is:

1. A method for fabricating a soft magnetic composite component by additive manufacturing, the method comprising:
   providing to an additive manufacturing system a powder comprising a plurality of particulates, each particulate comprising a soft magnetic metallic core coated with a continuous conformal dielectric coating comprising a dielectric material covering more than 90% of a surface area of the metallic core, wherein the continuous conformal dielectric coating is formed by deposition; and
   fabricating the soft magnetic composite component by forming consolidated material from the powder by additive manufacturing,
   wherein (i) additive manufacturing comprises Binder Jetting, (ii) a porosity of the magnetic composite component is less than 5% by volume, and (iii) the soft magnetic metallic cores in the magnetic composite component are electrically and magnetically isolated from each other by a continuous three-dimensional network of the dielectric material.

2. The method of claim 1, wherein the metallic core comprises a soft magnetic pure metal or alloy comprising at least one of Fe, Co, Ni, Fe—Co, Fe—Co—V, Fe—Ni, Fe—Si, FeCoSiB, FeSiAl, amorphous magnetic materials, metal-metalloid systems (metallic glasses), or alloys or combinations thereof.

3. The method of claim 1, wherein the metallic core comprises a coercivity selected from a range of 0.01 Oe to 50 Oe.

4. The method of claim 1, wherein the continuous three-dimensional network of the dielectric material comprises physical interfaces disposed between proximate particulates.

5. The method of claim 1, wherein the continuous dielectric coating comprises a first surface layer comprising a dielectric material comprising at least one of a hydride, an oxide, a nitride, a boride, a carbide, carbon, a sulfide, a fluoride, a polymer, phosphorus, or combinations thereof.

6. The method of claim 1, wherein a thickness of the continuous dielectric coating is less than 1 micrometer.

7. The method of claim 1, wherein fabricating the soft magnetic composite component comprises a densification step after additive manufacturing.

8. The method of claim 1, wherein the magnetic composite component has a tensile breaking strength greater than 150 MPa.

9. The method of claim 1, wherein the particulates comprise a unimodal particle size distribution with a mean particle size selected from a range of 100 nanometers to 250 micrometers.

10. The method of claim 1, wherein the powder further comprises a plurality of uncoated soft magnetic particulates, and a smaller mean particle size of the powder is a mean particle size of the uncoated soft magnetic particulates and a larger mean particle size of the powder is a mean particle size of the coated particulates, the plurality of uncoated soft magnetic particulates and the coated particulates comprising a same alloy.

11. The method of claim 1, wherein the continuous dielectric coating comprises a plurality of heterogeneous surface layers.

12. The method of claim 1, wherein a shape of each particulate is at least one of flat or oblong.

13. The method of claim 1, wherein a ratio of dielectric material to metal in the component is selected from a range of 1:1-1:2,500.

14. The method of claim 7, wherein densification comprises an isostatic method.

15. The method of claim 1, wherein deposition of the continuous conformal dielectric coating comprises at least one of atomic layer deposition (ALD), molecular layer deposition, physical vapor deposition, sol-gel, chemical vapor deposition (CVD), metal organic chemical vapor deposition (MOCVD), plasma torch synthesis, spray coating, high velocity oxygen fuel coating, arc coating, co-precipitation, epoxy coating, a supercritical $CO_2$ method, high pressure coating, or combinations thereof or (i) functionalizing each magnetic metallic core by applying a plurality of dielectric nanoparticles to the core, and (ii) densifying the dielectric nanoparticles to form the continuous dielectric coating.

16. The method of claim 1, wherein a thickness of the continuous conformal dielectric coating is at least 100 nanometers.

* * * * *